(12) United States Patent
Solie et al.

(10) Patent No.: US 12,224,736 B2
(45) Date of Patent: Feb. 11, 2025

(54) ALTERNATIVE STRUCTURE FOR REALIZING A TRANSVERSAL SAW FILTER

(71) Applicant: SenSanna Incorporated, Hanover, MD (US)

(72) Inventors: Leland P. Solie, Chetek, WI (US); Jacqueline H. Hines, Annapolis, MD (US); Andrew T. Hines, Annapolis, MD (US)

(73) Assignee: SenSanna Incorporated, Hanover, MD (US)

( * ) Notice: Subject to any disclaimer, the term of this patent is extended or adjusted under 35 U.S.C. 154(b) by 401 days.

(21) Appl. No.: 17/905,869

(22) PCT Filed: Mar. 10, 2021

(86) PCT No.: PCT/US2021/021784
§ 371 (c)(1),
(2) Date: Sep. 8, 2022

(87) PCT Pub. No.: WO2021/183696
PCT Pub. Date: Sep. 16, 2021

(65) Prior Publication Data
US 2023/0130157 A1    Apr. 27, 2023

Related U.S. Application Data

(60) Provisional application No. 62/987,651, filed on Mar. 10, 2020.

(51) Int. Cl.
*H03H 9/64* (2006.01)
*H03H 9/02* (2006.01)
*H03H 9/145* (2006.01)

(52) U.S. Cl.
CPC .......... *H03H 9/64* (2013.01); *H03H 9/02858* (2013.01); *H03H 9/14547* (2013.01); *H03H 9/14558* (2013.01)

(58) Field of Classification Search
CPC ............ H03H 9/02; H03H 9/145; H03H 9/25; H03H 9/64
See application file for complete search history.

(56) References Cited

U.S. PATENT DOCUMENTS 3,818,379 A * 6/1974 Wauk ................. H03H 9/02779
310/313 R
4,737,790 A * 4/1988 Skeie ................. G06K 19/0675
342/51

(Continued)

OTHER PUBLICATIONS

International Search Report and Written Opinion mailed May 20, 2021 in PCT/US2021/021784, 13 pages.

*Primary Examiner* — Andrea Lindgren Baltzell
*Assistant Examiner* — Alan Wong
(74) *Attorney, Agent, or Firm* — Rothwell, Figg, Ernst & Manbeck, P.C.

(57) ABSTRACT

Improved surface acoustic wave structures (or elements) that can be used to realize any of a wide variety of dispersive or non-dispersive transversal SAW filters that are distinct from prior known means for producing such filters are disclosed. The devices and structures may include stepped acoustic wave delay modification elements that can be used to implement transversal filter impulse response functions in a manner analogous to the use of interdigital transducers. The structures disclosed are of particular usefulness to implement SAW devices at high frequencies where normal photolithographic resolution would prove limiting. Aspects and embodiments of the present invention would be useful to produce SAW devices for use in a wide variety of applications, including as components in cell phones, in radar and other communications and electronic systems, and as wired or wireless sensors or sensor-tags.

19 Claims, 10 Drawing Sheets

(56) References Cited

U.S. PATENT DOCUMENTS

| | | | | |
|---|---|---|---|---|
| 4,748,364 A * | 5/1988 | Mitsutsuka | .......... | H03H 9/6403 |
| | | | | 333/153 |
| 4,878,036 A * | 10/1989 | Yatsuda | ............. | H03H 9/14547 |
| | | | | 333/195 |
| 4,965,480 A * | 10/1990 | Mochizuki | ............. | G06G 7/195 |
| | | | | 708/815 |
| 5,189,330 A * | 2/1993 | Niitsuma | ............... | G06G 7/195 |
| | | | | 333/195 |
| 6,856,214 B2 * | 2/2005 | Jian | ...................... | H03H 9/0285 |
| | | | | 333/195 |
| 6,967,545 B2 | 11/2005 | Abramov | | |
| 7,023,300 B2 | 4/2006 | Jian et al. | | |
| 7,791,249 B2 * | 9/2010 | Hines | ................. | H03H 9/14547 |
| | | | | 310/313 R |
| 9,537,677 B2 | 1/2017 | Hines et al. | | |
| 10,181,317 B2 * | 1/2019 | Brown | ................. | G10K 11/346 |
| 10,601,400 B1 | 3/2020 | McConney et al. | | |

* cited by examiner

ALTERNATIVE STRUCTURE FOR REALIZING A TRANSVERSAL SAW FILTER

CROSS-REFERENCE TO RELATED APPLICATIONS

This application is a 35 U.S.C. 371 National Phase Entry Application from PCT/US2021/021784, filed Mar. 10, 2021, which claims the benefit of U.S. Provisional Application No. 62/987,651, filed Mar. 10, 2020, both of which are incorporated herein by reference in their entireties.

BACKGROUND OF THE INVENTION

Field of the Invention

The field of the present invention relates to surface-launched acoustic wave devices, including surface acoustic wave devices, also referred to as SAW devices. More specifically, the present invention relates to a structure that can be used to realize any of a wide variety of dispersive or non-dispersive transversal SAW filters that is of particular usefulness to implement SAW devices at high frequencies where normal photolithographic resolution would prove limiting.

Description of Related Art

Surface Acoustic Wave (SAW) devices have been developed since at least the 1960's and are now widely used for the filtering of signals in electronics and communication systems, for signal recognition (as in spread spectrum systems), and for sensing applications. Surface waves are produced in piezoelectric substrates when a signal of appropriate frequency is applied to a SAW element known as a transducer. The transducer serves to transduce an electrical signal into an acoustic wave in the piezoelectric substrate. The simplest and most commonly used type of transducers are interdigital structures consisting of a series of conductive electrodes connected to two conductive busbars, with electrodes from the two busbars interleaved in a defined pattern. This produces a two-terminal device (electrically) that converts an incoming time varying electrical signal into a time-dependent and spatially distributed electric field pattern that strains the substrate in a time-varying manner (through the piezoelectric effect) and produces an acoustic surface wave on the substrate, which propagates in a direction perpendicular to the electrodes. In a simple transducer, which is bidirectional, the acoustic wave propagates away from the transducer in both directions. The electrode spacing sets the operating center frequency of the transducer, and the transducer length defines the response length in the time domain and also in the frequency domain. A transducer that is longer, i.e. has more electrodes or more wavelengths ($\lambda$), produces a response that is longer in the time domain and thus can be narrower in the frequency domain.

Surface acoustic wave devices have advanced greatly over the past half century, and today a wide range of SAW elements are used in design of high performance SAW components. The basic building blocks of SAW devices are structures we refer to, either individually or as a group, as 'SAW elements', and the commonly known SAW elements include bidirectional transducers, assorted unidirectional transducers, tapered and step-tapered transducers, apodized or otherwise weighted transducers, dispersive transducers, coded transducers, reflectors of various kinds (which can also include apodization, weighting, coding, etc.), multi strip couplers, waveguide elements, absorptive or acoustically lossy elements, and beam-steering elements. A subset of these elements can be combined to produce SAW devices that include delay lines, differential delay lines, resonators, structures such as ladder filters based on resonant responses, reflective sensors and sensor-tags, and a variety of other device types.

In a tapered transducer, the electrode width and spacing vary across the acoustic aperture, causing the transducer to operate at different frequencies in different acoustic 'tracks' or 'channels' distributed transversely across the acoustic aperture. The high and low frequencies defined by the electrode structures in these acoustic tracks define the bandwidth of the device. The tapered transducer structure enables separate definition of the bandwidth of the transducer and the time length of the transducer—which in a traditional non-tapered transducer are directly inter-related as described above, with longer transducers producing responses with narrower bandwidth. Realization of a wide passband response with a traditional, non-tapered transducer requires the use of a short transducer, which both limits the efficiency of electro-acoustic transduction (on a given substrate) and also makes use of tools such as weighting impractical. Separating the function of bandwidth definition from transducer time length choice in the tapered transducer means that wide passbands (large bandwidths) can be achieved while utilizing enough electrodes at each frequency within the tapered transducer to maximize the amount of energy injected into the acoustic wave, while avoiding production of excessive bulk wave losses.

It is known that the velocity of the surface acoustic wave can be impacted by films of various types applied to the surface of the SAW device in the acoustic propagation path. Since the acoustic wave is an electromechanical wave, anything that alters the mechanical or electrical properties of the surface will influence wave propagation. Note that throughout this discussion we will use the terms velocity and speed interchangeably, disregarding the traditional convention that velocity is a vector and speed is a scalar that equals the magnitude of velocity. When we use the term velocity we are referring to the speed at which the acoustic wave propagates.

Given an acoustic wave with velocity V on a free surface, electrically shorting out the surface of the device produces a reduction in acoustic wave velocity $\Delta V$ that is characteristic of the electromechanical coupling of the substrate material. This shorting can be accomplished using a thin conductive film, formed from a metal or other conductive material. The mass of the metal film, or of any film applied, must also be taken into account, as mass loading will also slow the acoustic wave. Stiffness the applied film must also be taken into account, since the mechanical characteristics of the film such as stiffness can either increase or decrease the wave velocity. Metal oxide films also impact wave velocity in similar ways. Viscoelastic films, such as polymers, generally cause wave slowing that is dependent on the mass loading and viscoelastic properties of the films. Films that have differing acoustic velocities from the substrate material can be used to form waveguides and other useful structures. Films such as dielectrics, polymers, semiconductors, and nanostructured films, other materials can be used to advantage in particular SAW device types, to implement various functions. For instance, in SAW chemical sensors, chemically selective films are used to detect particular chemicals in the sample.

One basic SAW device is the SAW delay line. A SAW delay line consists of a substrate capable of propagating thereon a surface acoustic wave (typically a piezoelectric, although early SAW devices were fabricated on metal such as sprung steel with piezoelectric elements used to couple acoustic energy into the metal), at least one transducer to convert electrical signals into acoustic waves, and at least one other SAW element (transducer or reflector) separated from the first transducer by an acoustic wave propagation path. If the second SAW element is a transducer, the device can function in transmission (S21) mode, with the acoustic wave launched from the first transducer converted by the second transducer back into an electrical signal, after a delay time that is determined by the transducer spacing and the acoustic wave velocity. Alternatively, the second transducer can act as a reflector (or a grating or other reflective element can be used), producing a one-port device with an S11 response that has a delay that is twice as long as a transmission device with the same propagation path would have, since the acoustic wave traverses the propagation path between the transducer and the reflector twice, doubling the signal delay.

Delay lines have been built with dispersive and non-dispersive transducers, including simple transducers and fairly complex structures such as dispersive tilted transducers and reflective array delay lines. In all such devices to date, the time domain extent and weighting of the acoustic wave signal is defined by the transducers and reflective elements of the device—i.e. the filtering function of the device is defined by the transducing and reflecting SAW elements. Device amplitude response is generally defined by the geometry of the SAW transducing and reflecting elements, which establish the time domain response and therefore also the frequency domain response of the device. On occasion, the delay, or equivalently the phase, of the delayed acoustic wave signal produced by these devices does not meet the goal of the designers.

Surface wave delay elements have been developed to slightly adjust the delay (or correspondingly the phase) of the acoustic wave to achieve target design performance. Means to control the delay of SAW signals have been shown, for example in U.S. Pat. No. 3,845,420, issued in 1974 to Melvin Holland (hereinafter "Holland"), which teaches the use of "a phase or velocity shifting conductive layer" (Holland, abstract) between the receiving and transmitting transducers, varying the shape of the conductive layer to produce a desired phase response. As described in column 1, lines 10-12, " . . . it is sometimes desired to alter slightly the delay or phase characteristics of an available device without having to manufacture a completely new device." The phase or velocity shifting layer serves to perform this slight modification of the acoustic wave propagation. Column 1, lines 33-39 of Holland state "Problems of the prior art concerning adjustment of phase response and time delay for a piezoelectric surface wave device may be overcome with the combination of means for propagating a surface wave in a piezoelectric material and means for varying the velocity of the surface wave over a portion of the piezoelectric material." Lines 47-53 of the same column go on to describe that the means for varying the velocity of the surface wave may be a sheet of conductive material, or a layer of photoconductive material that conducts in response to exposure to light. FIG. 1 of Holland shows a rectangular conductive layer 15 disposed on piezoelectric substrate 10 between transducers 13 and 14. Column 2, lines 44-47 explain "The spacing between fingers and the width of the fingers is determinative of the frequency response characteristics of the transducers.", which clearly conveys the understanding in the prior art that the device frequency response is defined by the transducing SAW elements. FIG. 2 shows a broadband tilted acoustic wave delay line, in which conductive layer 25 has been shaped, or contoured, to introduce the slight phase corrections desired at each frequency of the dispersive acoustic wave propagating between the two dispersive transducers 23 and 24.

Column 3, lines 52-60 of Holland teach that "The ratio between a wavelength in the piezoelectric material and the length of conducting layer needed for a change in phase of one wavelength is approximately 1:45. It may be immediately inferred that the length d of conducting layer 15 need be controlled only to one-forty-fifth the tolerance on the spacing between sets of fingers for the same overall device delay tolerance.", reflecting the fact that photolithography will not be a limiting factor for production of the phase-adjusting conductive layer. Column 3, lines 63-67 state " . . . an appropriate length of conductive coating may be deposited on the surface of the substrate to correct for the difference between desired and measured phase or delay characteristics." This again reinforces the understood prior art, wherein phase or delay altering materials were used to slightly alter the phase or delay performance of a SAW device.

Column 6, lines 23-29 state "For example, a multi-tap delay line may be constructed taking advantages of the teachings of the present invention. In such a delay line, the precise delay time between taps may be controlled using a metal conductive layer as described above specifically fashioned for the precise delay time desired." Although nowadays electrical tapped delay lines are commonly discussed as devices that take in a signal and produce a train of delayed versions of the signal that have been weighted and summed, the acoustic tapped delay line at the time Holland was written was a very different device. In the type of acoustic multi-tap delay line mentioned in Column 6, line 23 of Holland, an acoustic wave launched by an input transducer propagates along the substrate surface, and (generally short) transducers are used to 'sample' the wave, producing independent electrical output signals at discrete delays. This type of acoustic tapped delay line is commonly used in radar systems, simulating the delays introduced by targets at different ranges. The precise delay of each tap in this acoustic tapped delay line could be controlled, as in Holland, by introducing rectangular metal regions in between pairs of transducers along the tapped acoustic wave path.

Other prior art also describes control and compensation of phase and, in some cases amplitude, of the acoustic signal. U.S. Pat. No. 3,882,429, issued in 1975 to Tom Martin (hereinafter "Martin") teaches use of "phase affecting material" (abstract, line 10) to shape or compensate the phase response of the device without changing the amplitude response. Column 3 lines 58-64 of Martin state "A region 40 of phase affecting material is located on the medium or strip 12 in the path of the reflected acoustic signal. Region 40 has a profile or configuration and thickness which is pre-designed or selected to shape the phase response of device 10 without affecting the amplitude response." Column 3 lines 26-28 also states "acoustic damping material 30 such as mastic can be applied to strip 12 for shaping the amplitude response of device 10." Thus, in Martin, both amplitude and phase of the acoustic wave can be affected, but by two separate applied materials, damping material 30 and phase-shaping material 40. Note that in FIG. 3 of Martin it is made clear that the acoustic absorber material 30 is on the upper surface of the metal substrate, while the phase-shaping material 40 is applied separately to the back side of the substrate. The substrate of Martin is metal, such as sprung steel, and the purpose of elements 30 and 40 is to compensate or slightly adjust one or both of the amplitude and phase of the response, with the primary characteristics of the time and frequency domain responses of the device produced by the transducers and reflective arrays shown in the device.

U.S. Pat. No. 3,952,269 to Thomas Bristol (1976) teaches the use of interdigital electrode structures with appropriate interconnections, placed in the surface acoustic wave propagation path, as time delay (or phase) compensation structures. In that invention, electrodes could be selectively severed to electrically isolate them to alter the phase or delay performance.

U.S. Pat. No. 3,818,379 to Michael Wauk, II (1974) teaches use of a triangular-shaped conductive "surface wave acoustic wavefront rotating member disposed in the path of the wave between the transducers." (Abstract). The purpose of this conductive triangle (shown in FIG. 1 of Wauk) is to cause the wavefront of the surface acoustic wave to be sequentially retarded by longer delay times moving from one edge of the acoustic aperture to the other, resulting in a rotation of the wavefront exiting the conductive triangle region. The longer the wave propagation path under the metal triangle, the more the wavefront at that transverse location in the acoustic aperture will be delayed. Hence, in FIG. 1 of Wauk, the line parallel to the transducer electrodes used in the definition of the angle $\varepsilon$ corresponds to the position the acoustic wavefront would have been in had there been free surface propagation only (i.e. in the absence of the conductive triangle). The line tilted to the left in FIG. 1 to define represents the actual wavefront after the wave passes through the conductive triangular region, which has been rotated counterclockwise by the delays added at each position across the acoustic aperture of the device. This figure is somewhat misleading, insofar as the wavefront position at the lower edge of the acoustic aperture should be coincident with the position of the free-surface wavefront, and the wavefront should tilt left from that point—it is not possible for the conductive triangle, at the bottom where its length along the acoustic propagation path is zero, to reduce the wavefront delay below that of the free surface. Thus the vertical position indicating the hypothetical free-surface wavefront is not correctly positioned for this device. We note that Wauk teaches (Column 6, lines 16-20) that in addition to metals, a thin film of any material that is conductive with respect to the surface wave energy can be used to form the wavefront rotation element.

The wavefront rotation surface wave element (23 or 59) of Wauk serves to (Column 4, lines 7-19) reduce the level of undesired spurious signals from specular reflections from the device's transducers, and to suppress triple transit signals, both by tilting the acoustic wavefront to cause phase cancellation of the waves reflected at certain angles without requiring tilting of transducers relative to their normal position (with electrodes normal to the acoustic wave propagation path). The wavefront rotation element 59 is shown as a generally triangular shape in which the hypotenuse is a continuous curve rather than a straight line. Column 6, lines 25-28 show that for use with slanted dispersive transducers such as 51 and 53 in FIG. 2 where the acoustic waves at different transverse positions within the acoustic aperture are at different frequencies, a wavefront rotation surface wave element would preferentially have a curved "more suitable and general" shape to cancel triple transit at multiple frequencies across the passband.

Having described the relevant prior art for SAW phase and delay adjusting elements, and a related wavefront rotation element that is based on adjusting the wave velocity and hence delay, we now have the basis for identifying the unique features and structures of, and benefits provided by, the present invention.

SUMMARY OF THE INVENTION

Aspects of the present invention may provide improved surface acoustic wave structures (or elements) that can be used to realize any of a wide variety of dispersive or non-dispersive transversal SAW filters that are distinct from prior known means for producing such filters. The present invention may be of particular usefulness to implement SAW devices at high frequencies where normal photolithographic resolution would prove limiting. Aspects and embodiments of the present invention may be useful to produce SAW devices for use in a wide variety of applications, including as components in cell phones, in radar and other communications and electronic systems, and as wired or wireless sensors or sensor-tags.

The stepped (or offset) acoustic wave delay modification element (or structure) may provide the SAW designer with a tool for additional flexibility to optimize device performance, in a manner distinct from but somewhat analogous to the flexibility provided by tapered transducers. As described above, the tapered transducer structure decouples the definition of the bandwidth of a transducer from the time length of the transducer, providing flexibility for the SAW designer. In an unrelated but somewhat analogous manner, the stepped acoustic wave delay modification element separates (or decouples) the process of transduction from the process of sculpting the signal response in the time and frequency domains, i.e. the process of filtering. The transducer is responsible for transducing the incoming electrical signal into a relatively broadband acoustic wave, and the stepped (or offset) acoustic wave delay modification element is formed to implement the filter function desired using this incoming wave (and taking into account the output transducer transfer function). This may allow the SAW designer to optimize the structure of the transducer(s) for efficient transduction of energy into the substrate, minimization of loss of energy into bulk waves, and optimal electrical match to the source circuit (or antenna if wireless) without compromising this match due to concerns for how optimization will impact the transfer function of the filter. In general, a fairly short transducer (with a relatively few number of wavelengths) can be used for the energy transduction process, although preferably enough electrodes would be used to inject as much energy as possible into the acoustic wave on the selected piezoelectric substrate, to minimize device insertion loss. For example, on Y-cut Z-propagating lithium niobate ($LiNbO_3$), an input (or input/output) transducer as short as $5\lambda$ can be used to transduce fairly wideband signals into acoustic waves, although use of transducers of $10\lambda$ (or more) long will result in reduced insertion loss (or reduced reflection loss for one-port reflective devices, such as passive sensors and sensor-tags). Of course, the acoustic aperture would need to be properly chosen to provide a good acoustic match to the substrate, and to electrically match the transducer to the input electrical circuit (although external matching components can also be used to match the transducer to the circuit). Transducers can be optimized to produce the lowest possible insertion loss at harmonic operating frequencies, and the filter function is primarily defined by the stepped (or offset) acoustic wave delaying element, which has non-critical photolithographic precision requirements relative to the transducers. This may enable production of high frequency SAW devices with more manageable photolithographic processes suitable for production of lower (fundamental) frequency SAW devices.

The stepped acoustic wave delay modification element is a structure formed on the surface of the substrate on which a surface acoustic wave propagates, that is made of a thin film material (metal, semiconductor, nonmaterial, or dielectric) that alters the SAW velocity without significantly attenuating the wave as it propagates through the element. The shape of the stepped acoustic wave delay modification element is a set of adjacent rectangles of differing lengths, with lengths oriented in the direction of wave propagation, defining acoustic 'channels' within the acoustic aperture. The differing rectangle lengths may be related in a defined manner as described below, so that the acoustic wavelets emerging from each channel at the output of the delay modification element add with a specified phase relationship at a given distance along the device. Each 'step' of the stepped acoustic wave delay modification element introduces a discontinuity in the phase of the wavelet emerging from the delay modification element in a single channel, relative to the wavelets emerging from the adjacent channels.

Assuming that the film of the delay modification element produces a decrease in acoustic wave velocity, wavelets emerging from channels with short delay element propagation paths come out sooner than those with longer delay element propagation paths, since the velocity in these short delay element paths has only been reduced for a short time, producing a small delay offset relative to free-surface wave propagation, while longer delay element propagation paths introduce larger delays. Thus, the combined wavefront coming out of the delaying element has been spread out in time relative to the incoming acoustic wave signal. Spreading in time is equivalent to narrowing in the frequency domain, i.e. filtering. The channel widths can be made unequal, to increase the amount of energy in certain channels relative to others. This weights the energy occurring at selected times, implementing apodization (comparable to electrode overlap apodization or withdrawal weighting in ordinary SAW transducers). Apodization allows designers to produce filters with desirable passband shaping and out-of-band rejection. A uniform output transducer, multistrip coupler, reflector, or other SAW element with a uniform profile across the acoustic aperture is used to pick up, transduce, or regenerate/reflect the wave.

The lengths of the delay element rectangles in each channel vary from channel to channel to implement the desired filter transfer function. The step in delay from channel to channel will be equal for an ordinary non-dispersive filter. To implement this step in delay, which is equal to an integer multiple of the acoustic period, the difference in length between channels will be an integer multiple of the acoustic wavelength $\lambda$ (taking into account the velocity in the structure to ensure a phase change of $2\pi$). We would generally choose a difference of $1\tau$ as a delay step for ordinary filters. Dispersive filters can be implemented by making the difference in rectangle lengths between different delay element rectangles vary by different amounts. This spreads out the acoustic wave different amounts in time for different frequencies, i.e. it introduces dispersion. Codes such as Barker and pseudo-noise (PN) codes (among others) can be implemented with bits of various desired time lengths by using a $N\lambda$ rectangle length step for +1 bits, and a $(2N-1)\lambda/2$ step for −1 bits in the code.

The offset acoustic wave delay modification element may implement the same acoustic delays as in the stepped acoustic wave delaying element, but with the rectangles that comprise the delaying element positioned differently along the SAW propagation path, and potentially shuffled from side-to-side across the acoustic aperture (rather than monotonically increasing in length transversely across the aperture). Parallelograms with sides parallel to the direction of acoustic wave propagation can also be used to implement stepped or offset acoustic wave delaying elements, reducing specular reflections from the end of the delaying elements and potentially triple transit signal levels as well.

The present invention may provide physical embodiments of SAW devices incorporating stepped (or offset) acoustic wave delay modification elements with aspects that produce beneficial operation over prior art. In addition, the present invention may provide for SAW devices that can be made to operate at high frequencies without increased demands on photolithographic resolution. Keeping in mind that the frequency response is determined by the stepped acoustic wave delay modification element, while the launching of the acoustic wave is performed by the transducer, we note that for a 10 GHz SAW device, with $\Delta V/V=2.5\%$, the critical dimensions on the delay modification element are on the order magnitude of $V/\Delta V=40$ times larger than traditional electrodes at 10 GHz, i.e. the critical dimension of the delay modification element is similar to that of a 250 MHz transducer. Of course, transducers capable of generating higher harmonics to launch the acoustic wave at 10 GHz are still needed, and may have more demanding lithography.

One aspect of the invention may provide a surface acoustic wave (SAW) device. The saw device may include a piezoelectric substrate, at least one SAW element, a stepped acoustic wave delay modification element, and at least one additional SAW element. The at least one SAW element may include an interdigital transducer (IDT). The at least one IDT may be configured to launch acoustic waves onto the piezoelectric substrate as a combined wavefront that extends across an overall acoustic aperture. The acoustic aperture may be spatially divided into a set of acoustic tracks parallel to the direction of acoustic wave propagation, and the portion of the combined wavefront propagating in each acoustic track is a wavelet. The stepped acoustic wave delay modification element may include multiple regions within the acoustic tracks. The multiple regions may include two or more film regions in which a thin film of material (or coating) that will alter the SAW velocity is formed or deposited on the surface of the piezoelectric substrate. Lengths of the film regions may vary from track to track, creating steps in the delay of the wavelets emerging from the acoustic tracks. The length of the film region in some tracks can be zero. Some tracks may have no film, in which case the SAW velocity in these tracks is the free surface velocity. The combined wavefront comprising wavelets from all of the acoustic tracks emerging from the stepped acoustic wave delay modification element is spread out in time to implement a transversal filter impulse response function. The at least one additional SAW element may be configured to interact with said combined wavefront across the entire aperture.

In some embodiments, the thin film of a material that will alter the SAW velocity may be selected from among the material classes of metals, semiconductors, nanostructured materials, or dielectrics. Materials that alter the SAW velocity with minimal increase in wave attenuation may be preferred.

In some embodiments, the difference in the length of the film region between each acoustic track and the acoustic track with the next longer film region is a length that introduces a delay equal to one period of the acoustic wave at the center frequency of operation of the stepped acoustic wave delay modification element. This structure causes the wavelets emerging from all of the acoustic tracks to be in phase, but spread out in time to implement a desired transversal filter impulse response function.

In some embodiments, the width of each acoustic track within the stepped acoustic wave delay modification element is modified to alter the amount of energy contained in the wavelet emerging from that track, relative to the other wavelets, to implement apodization or weighting of wavelets emerging at different delay times. This produces a combined wavefront (adding up all the wavelets) that is both spread out in time and amplitude weighted to implement a desired transversal filter impulse response function.

In some embodiments, the IDT may be a conventional interdigital transducer. In other embodiments, tapered or step-tapered transducers may be preferred.

In some embodiments, the difference in the length of the film region between each acoustic track and the acoustic track with the next longer film region is a length that introduces a delay equal to either an integer multiple of one period of the acoustic wave (Mτ) or a delay that differs by half a period (2M±1)τ/2 from that integer multiple of one period of the stepped acoustic wave delay modification element. This structure causes the wavelets emerging from certain acoustic tracks to be in phase with wavelets emerging from certain other acoustic tracks; whereas the wavelets emerging from other certain acoustic tracks are out of phase with wavelets emerging from still other acoustic tracks and cancel. The combined wavefront formed by the wavelets from all of the acoustic tracks emerging from the stepped acoustic wave delay modification element is spread out in time and phase modulated to implement a coded sequence.

In some embodiments, the step in length of the film region between each acoustic track and the acoustic track with the next longer film region is given by $\lambda_i V/\Delta V$, where $\lambda_i$ is the local wavelet frequency, V is the free surface SAW velocity, and $\Delta V$ is the change in wave speed caused by the presence of the film. This structure produces wavelets emerging from each acoustic track that are at different frequencies than the wavelets emerging from other acoustic tracks. The combined wavefront formed by the wavelets from all of the acoustic tracks emerging from the stepped acoustic wave delay modification element is spread out in both time and frequency to implement a dispersive transversal filer impulse response function.

Other embodiments may include an external impedance varying sensor electrically connected across one of the SAW elements. This sensor may produce an impedance that changes with a parameter to be measured. As the external impedance changes, so does the amplitude of the acoustic wave reflected from the SAW element to which the external sensor is attached. This yields a SAW sensor-tag, device that can measure at least one parameter through the action of the external sensor.

Various embodiments may include regions within each acoustic track that are coated with a thin film of a material that will alter the SAW velocity are shaped like rectangles, while other embodiments may include regions shaped like parallelograms. Generally, the long side of either region shape will be aligned with the direction of acoustic wave propagation. In some embodiments, the film regions may be arranged such that one end of all of the regions are lined up on the substrate at one distance from the IDT that launches the acoustic waves. Other embodiments may arrange the film regions such that the ends of each of the film regions are staggered at two or more different distances along the direction of acoustic wave propagation from the IDT. In some embodiments, the film regions may be arranged in order of increasing length across the acoustic aperture, while in others the regions may be shuffled transversely to the direction of acoustic wave propagation such that they are not arranged in order of increasing length across the acoustic aperture.

Certain embodiments may utilize one or more interdigital transducers as the additional SAW element to interact with the combined wavefront emerging from the acoustic wave delay modification element. Alternate embodiments may use reflectors or multistrip couplers. Specific combinations of these elements may produce SAW devices with beneficial characteristics. In some embodiments, at least two additional SAW elements with individual acoustic apertures that each cover a portion of the entire aperture over which the combined wavefront exists can be configured to interact with a portion of the combined wavefront to implement desired responses.

One aspect of the invention may provide a surface acoustic wave (SAW) device. The saw device may include a piezoelectric substrate, at least one SAW element, a stepped acoustic wave delay modification element, and at least two additional SAW element. The at least one SAW element may include an interdigital transducer (IDT). The at least one IDT may be configured to launch acoustic waves onto the piezoelectric substrate as a combined wavefront that extends across an overall acoustic aperture. The acoustic aperture may be spatially divided into a set of acoustic tracks parallel to the direction of acoustic wave propagation, and the portion of the combined wavefront propagating in each acoustic track is a wavelet. The stepped acoustic wave delay modification element may include multiple regions within the acoustic tracks. The multiple regions may include two or more film regions in which a thin film of material (or coating) that will alter the SAW velocity is formed or deposited on the surface of the piezoelectric substrate. Lengths of the two or more film region may vary from track to track, creating steps in the delay of the wavelets emerging from the acoustic tracks. The combined wavefront may include wavelets from all of the acoustic tracks emerging from the stepped acoustic wave delay modification element is spread out in time to implement a transversal filter impulse response function. The at least two additional SAW elements may include individual acoustic apertures that each cover a portion of the entire aperture over which the combined wavefront exists, and each of the at least two additional SAW elements may be configured to interact with a portion of said combined wavefront.

Still other aspects, features, and advantages of the present invention are apparent from the following detailed description, simply by illustrating exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The present invention will be understood more fully from the detailed description given below and from the accompanying figures and drawings of various embodiments of the invention, which, however, should not be taken to limit the invention to the specific embodiments, but are for explanation and understanding only.

DETAILED DESCRIPTION OF THE INVENTION

Aspects of the present invention may provide improved SAW device elements, embodiments, and design methods relating to stepped (or offset) acoustic wave delaying elements, that have aspects that produce beneficial operation and/or enhanced ease of manufacture over prior art. This technique is a means of implementing a SAW filter at rather high frequencies where normal photolithographic capabilities limit the ability to fabricate interdigital electrodes with very narrow lines and gaps. One key element of the SAW device may be a structure that spans almost an entire SAW acoustic aperture, where the incoming SAW beam (or constant phase wavefront) is constant in amplitude and phase across the acoustic aperture. Note that the frequency of the SAW signal may vary across the aperture, which will be addressed below. The source of this input SAW beam could be an interdigital transducer, a multistrip coupler (MSC), or any other SAW element that produces a uniform beam across its aperture.

In some embodiments, the SAW device may include a stepped acoustic wave delay modification element (a "stepped element" or "delay element" or "stepped delay element"). In some embodiments, the stepped acoustic wave delay modification element may be roughly shaped like a right triangle, but with a hypotenuse that consists of a stairstep-like sequence of rectangular steps. The stepped acoustic wave delay modification element includes a thin film of a material (metal or semiconductor or dielectric) on the SAW substrate that will alter the SAW velocity but not significantly attenuate the wave as it propagates through the stepped element. When the SAW exits the stepped element, it is no longer uniform in phase and amplitude across its aperture and so must be followed by an output element with uniform beam across the entire aperture, such as an interdigital transducer, a multistrip coupler (MSC), or any other uniform beam SAW element.

Figure 1:
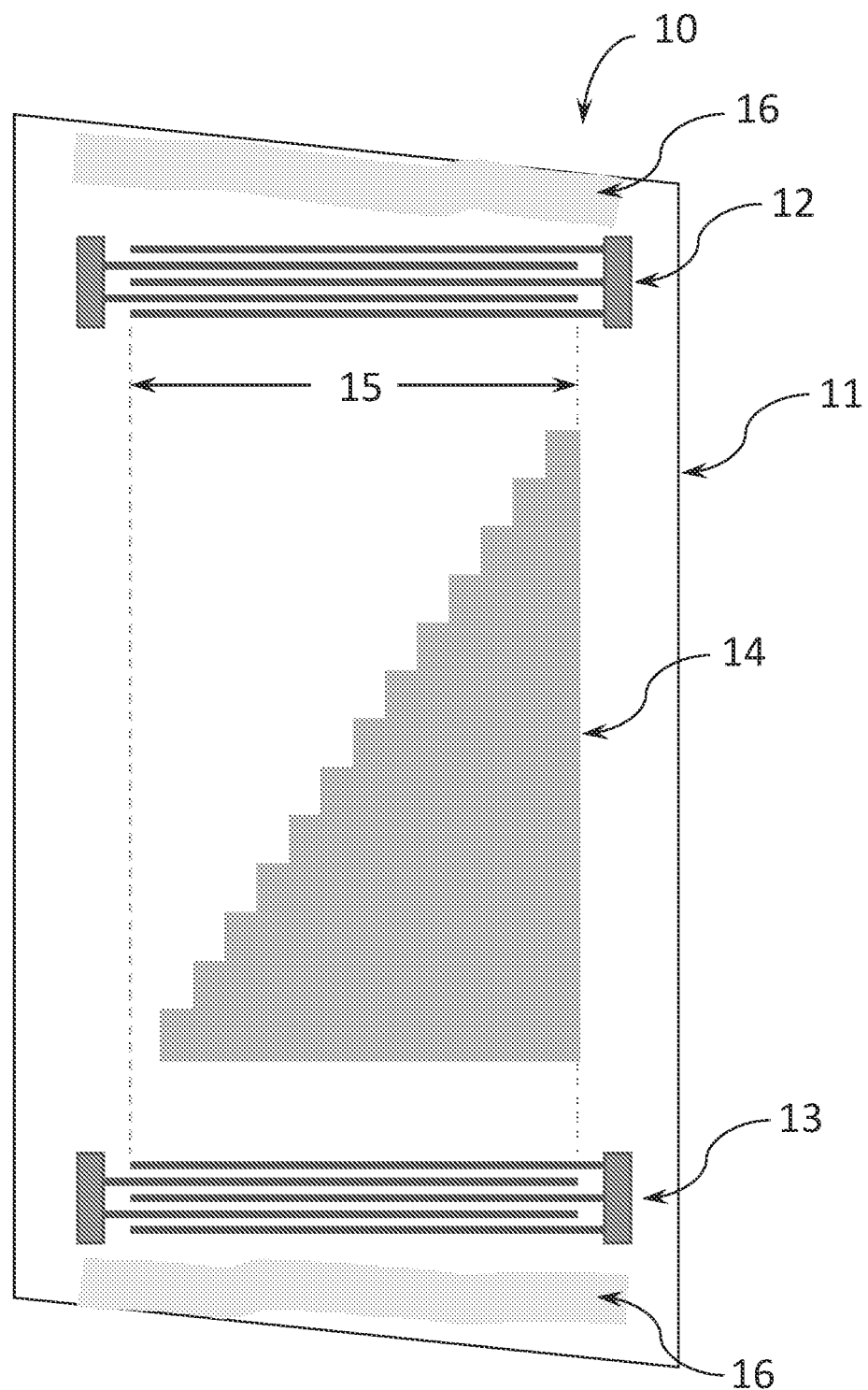
FIG. 1 shows a schematic representation of the SAW elements in a SAW device embodiment of the present invention using an unapodized stepped acoustic wave delaying element.

In some embodiments, the SAW device, indicated by 10 in FIG. 1, may include a piezoelectric substrate 11 on which a surface acoustic wave is launched by interdigital transducer 13, which launches a surface acoustic wave upward toward the stepped acoustic wave delay modification element 14 (a wave is also launched downward if the transducer 13 is bidirectional, but that wave is damped by acoustic absorber 16). The acoustic wave has a uniform wavefront as it exits transducer 13, and exists over the entire acoustic aperture 15. The acoustic wave propagation direction is upward, perpendicular to the electrodes in transducer 13. At the far left side of the acoustic aperture, the acoustic propagation path is a free surface path, while over the rest of the aperture the wave propagates through the stepped element, with delay times determined by the acoustic wave velocity under the stepped element and the propagation length through the element for each 'step'. After exiting the stepped element, the wavefront, which now had been spread out in time by the stepped acoustic wave delay modification element 14, is detected by output interdigital transducer 12.

The stepped acoustic wave delay modification element 14 of this embodiment may be designed to generate the time domain acoustic wave impulse response needed to, when convolved with the impulse responses of the input and output transducers (13 and 12 respectively), produce a variety of desirable frequency responses, just as a conventional SAW transversal filter can be designed to implement a wide range of frequency responses.

As previously stated, the thin film in the stepped acoustic wave delay modification element 14 changes the velocity of the surface wave as the wave propagates through the stepped element. The most obvious choice for the film is a thin metal film which shorts the electric fields at the surface and thus reduces the SAW velocity on a piezoelectric substrate by the amount $\Delta V_m/V$, where V represents the free surface wave velocity. The impact of mass loading on surface wave velocity would also need to be taken into account in order to determine the net effective velocity change for the wave propagating through the stepped element, which we refer to as $\Delta V$, where $\Delta V$ is the overall change in wave speed caused by the electrical, mass loading, and viscoelastic/stiffness (or mechanical) properties of the film. While we have so far only discussed slowing of the acoustic wave by the stepped element, it should be noted that the SAW velocity can be either increased or decreased (i.e. the wave can be caused to propagate either faster or slower) by a metal, semi-conductive, nanostructured, or dielectric film of appropriate properties that is deposited on the surface of the substrate to form the element. So while we may sometimes refer to the stepped element as an acoustic wave "delaying" element, we consider the more general term "acoustic wave delay modification element" to be more appropriate, since the delay can be increased or reduced.

Figure 2:
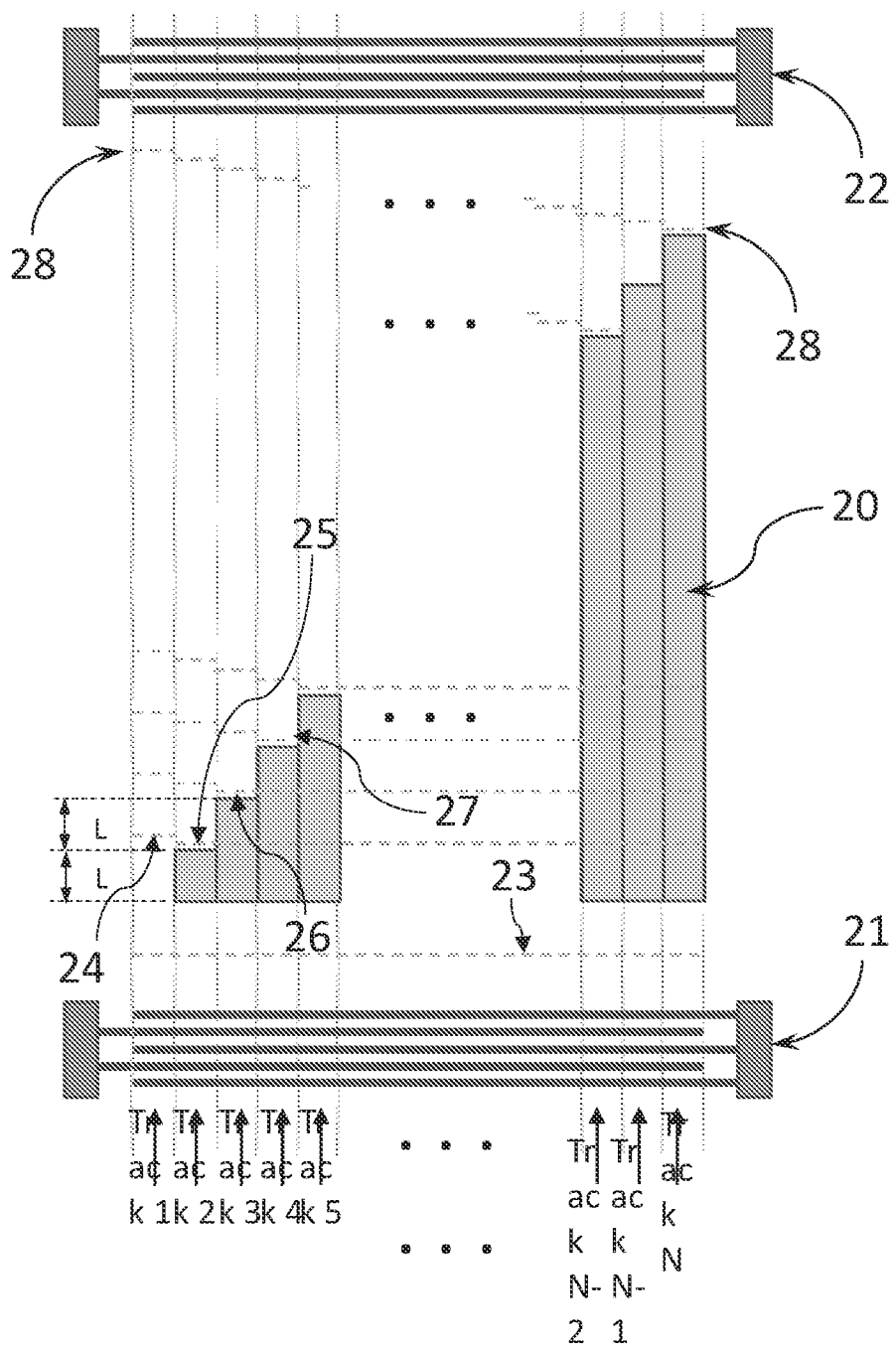
FIG. 2 shows a schematic representation of the SAW elements in a SAW device embodiment of the present invention using an apodized stepped acoustic wave delaying element.

FIG. 2 illustrates how a desired impulse response may be generated with a stepped acoustic wave delay modification element. The stepped element 20 can divided into N parallel acoustic wave propagation tracks which span the acoustic beam, indicated by the light dashed lines and labels Track 1 through Track N in FIG. 2. These tracks are not assumed to be equal in width, although they have been drawn this way for convenience in FIG. 2. Each track is rectangular in shape with the bottom edge of each track rectangle coincident with the bottom of the overall delay modification element as shown in the figure. Note that in Track 1, there is no thin film rectangular delay modification element shown in the embodiment of FIG. 1 (although a stepped acoustic wave delay modification element that has rectangles in all tracks is also within the scope of the present invention). The surface wave velocity in Track 1 of FIG. 2 is therefore the free surface velocity V. For a wave frequency f, the acoustic wavelength is given by $\lambda=V/f$, and the time corresponding to one wavelength (the wave period) is given by $\tau=1/f$. At velocity V, the wave travels a distance D in time $t=D/V$, which corresponds to $t/\tau=fD/V$ wave periods. Thus the wave experiences a phase change of $\phi=2\pi fD/V$ when traveling the distance D. Now, if the velocity changes to $V'=V+\Delta V$ the corresponding phase change will be $\phi'=2\pi fD/V'$. The phase difference due to the change in velocity is thus $\Delta\phi=(2\pi fD/V)*\Delta V/(V+\Delta V)\simeq 2\pi fD\Delta V/V^2$ for small $\Delta V/V$. While this is a reasonable approximation for commonly used piezoelectric substrate materials, where the electromechanical coupling $k^2$ is effectively equal to $\Delta V_m/V$ where $\Delta V_m$ is the change in wave velocity due to electrical shorting, the full expression for $\Delta\phi$ would be more precise for purposes of filter design. But using the above approximation, in order for the change in phase caused by propagation under a film that causes a total acoustic wave velocity change of $\Delta V$ (including all factors, not just the shorting effect) to equal $2\pi$, requires a film propagation distance L such that $2\pi=2\pi fL\Delta V/V^2$. Reorganizing terms, we find $L=\lambda V/\Delta V$. Hence for a wave of frequency f, with a wavelength $\lambda$, the wavefront will be retarded by one wavelength $\lambda$ as it propagates a distance $L=\lambda V/\Delta V$ through a region where the velocity is decreased by $\Delta V$ relative to the free surface velocity V.

In FIG. 2, the wavefront 23 of an acoustic wave launched by transducer 21 is at the same phase at all positions across the acoustic aperture. The horizontal dashed line segments in FIG. 2 represent the spatial positions of a constant phase wavefront 23, which spread out along the direction of wave propagation as the wave propagates through the stepped acoustic wave delay modification element 20.

FIG. 2 assumes that the first element or wavelet of the impulse response wavefront is generated in the first track on the left (Track 1) and each sequential 'wavelet' of the impulse response wavefront is generated by successive tracks moving from left to right in FIG. 2. We define a 'wavelet' as the portion of the original wavefront that exists in a single acoustic track. In Track 1 the wavelet corresponds to the portion of the original undelayed wavefront that exists in Track 1. In other tracks, the wavelet is the portion of the wave that emerges from the rectangular portion of the delay modification element in each track, each wavelet having its own delay offset relative to the undelayed wavefront. The resulting wavefront consists of the combination of the multiple wavelets from all N acoustic tracks.

The acoustic wave speed in Track 1 is the free surface velocity V, and in each of Track 2 through Track N a portion of the acoustic propagation path is covered by a rectangular region of the acoustic wave delay modification element. Assuming that the acoustic wave velocity in the delay modification element region is decreased by $\Delta V$, in Track 2 the wave propagates through a film region of length. L, where $L=\lambda V/\Delta V$, and the wavelet 25 emerging from the delay modification element 20 in Track 2 is spatially delayed by $\lambda$, one acoustic wavelength, relative to 24, the undelayed wavefront in Track 1. Hence these two sections of the wave are in phase, but are spread out spatially (and in time) by the added delay in Track 2.

The rectangular regions of the acoustic wave delay modification element increase in length by a step of length $L=\lambda V/\Delta V$ from track to track, again moving from left to right in FIG. 2. This creates a time delay for each successive wavelet (moving left to right) of $\tau$ relative to the wavelet emerging from the acoustic wave delay modification element in the track to the left. Hence the overall wavefront 26 comprises N wavelets, each sequentially offset in time by $\tau$. The amplitude of each wavelet is proportional to the width of the track.

To see how this process performs a filtering function consider how the impulse response is generated by following how single wavefront 23 emanating from the input transducer 21 evolves as it enters and propagates through the acoustic wave delay modification element. In FIG. 2, wavefront 23 is flat as it emerges from transducer 21, and if sampled at this time it would generate a simple impulse. Wavelets 24 and 25 show how wavefront 23 has been changed as it emerges from Track 2. Note that Track 1 has no film (no acoustic wave delay modification element) in its path because it is the baseline delay from which successive tracks reference their delay, i.e., the signal emerging from the delay modification element 20 in Track 2 is delayed by the film in that track, relative to the delay of the signal emerging from Track 1 (which has no film) as shown by wavelets 24 (undelayed) and 25 (delayed). The delay offset that can be seen between Track 1 and Track 2 is the period $\tau$ which is one acoustic wave period, as discussed above. As an example, if $\Delta V/V$ is 2.5% (which is realistic for the piezoelectric coupling, which makes up a majority of the change in velocity in the film region) then the step L in length from track to track must be $\lambda/0.025=40\lambda$ in order to create a delay step of $\tau$ (and a one $\lambda$ spatial offset) in the resulting wavelet. In an ordinary nondispersive interdigital transducer the spatial period from one tap to the next is constant throughout the transducer and is equal to the acoustic wavelength $\lambda$. For the acoustic wave delay modification element filter, the step from one track to the next is a constant length $L=\lambda N/\Delta V$. The wavelet 26 is the impulse response wavefront as it emerges from Track 3, The overall wavefront at this point shows two steps in the constant phase wavefront position. Similarly for wavelet 27 emerging from Track 4 where the overall constant phase wavefront now has three steps. Finally, wavefront 28 shows the constant phase wavefront as it emerges from the last track (Track N) of the acoustic wave delay modification element. Wavefront 28 represents the complete SAW impulse response of the acoustic wave delay modification element transversal filter. The width of each track is proportional to the amplitude of that effective tap in the impulse response. SAW wavefront 28 will generate an electrical impulse response as each wavelet sequentially passes through output transducer 22. The frequency response of this filter is the Fourier transform of the impulse response.

Figure 3:
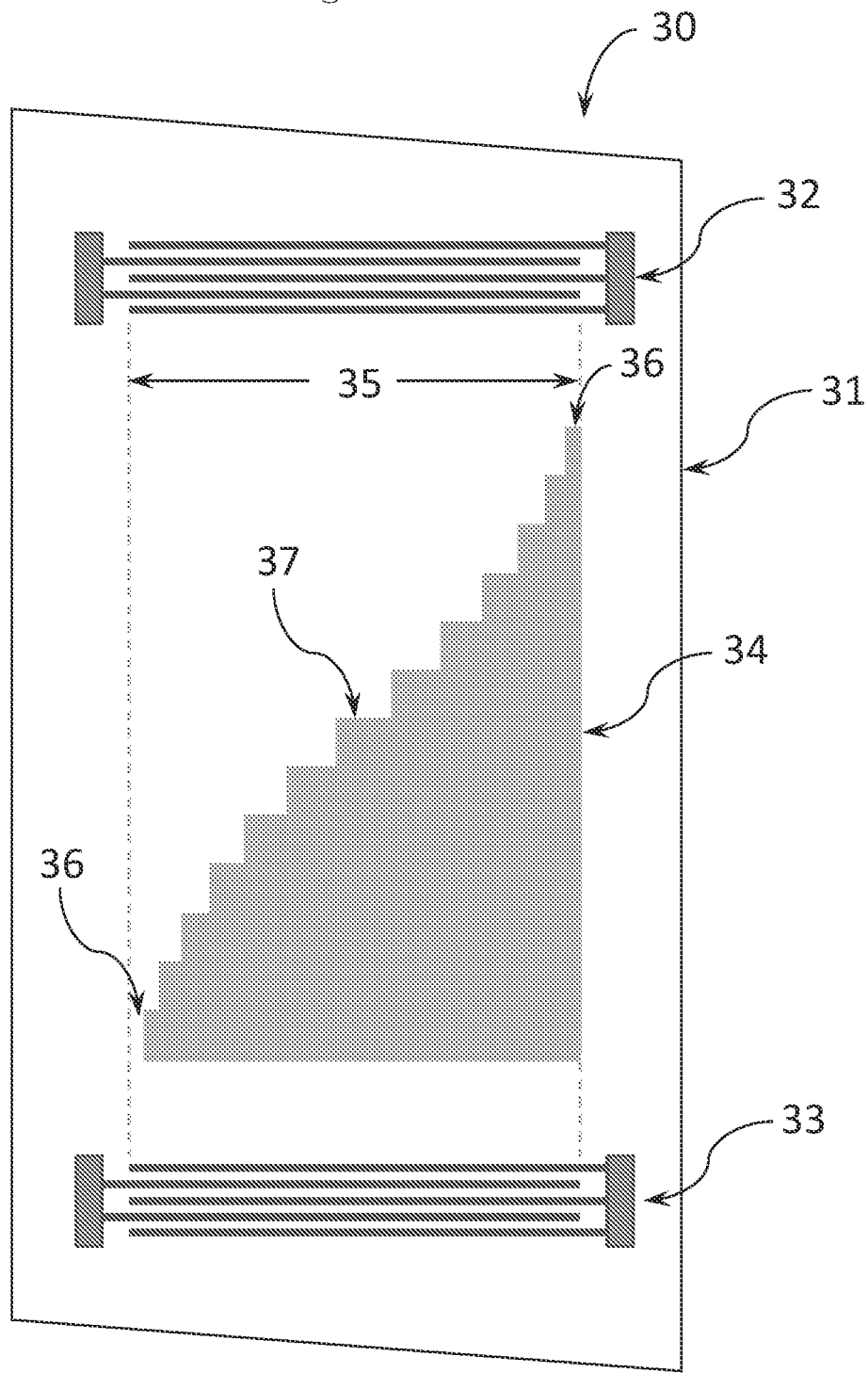
FIG. 3 shows schematically how desired impulse responses may be generated via the geometric configuration of the stepped acoustic wave delaying element according to the present invention.

FIG. 3 shows a SAW device embodiment 30 of the present invention that includes an apodized stepped acoustic wave delay modification element 34. This SAW device embodiment 30 comprises a piezoelectric substrate 31 on which a surface acoustic wave is launched by interdigital transducer 33, which launches a surface acoustic wave upward toward apodized stepped acoustic wave delaying element 34. The acoustic wave has a uniform constant phase wavefront as it exits transducer 33, and exists over the entire acoustic aperture 35. Apodized stepped acoustic wave delaying element 34 comprises multiple parallel acoustic tracks as in FIG. 2, but as shown in FIG. 3, the outer tracks 36 are narrower than tracks near the center of the acoustic wave delay modification element 34. The center track 37 is the widest track in the example shown. Acoustic wave delay modification element 34 thus produces a wavefront comprised of multiple wavelets from each track that have different widths (hence containing more total energy) corresponding to the track widths, that occur sequentially spaced out in time by one wave period τ. When these wavelets are summed by the electrodes of transducer 32 this will produce an overall device impulse response that is equivalent to that of an apodized interdigital transducer.

Note that while constant delay steps of τ between tracks have been shown thus far, non-dispersive impulse responses could be constructed with delay steps that are other integer multiples or divisors of τ. This could correspond to subsampling in an interdigital transducer, or alternatively the step spacing τ could be based on the period corresponding to a harmonic of the fundamental frequency of the input and output transducers. Thus, if input and output transducers 32 and 33 in FIG. 3, for instance, are conventional split-electrode interdigital transducers that exhibit odd harmonics, the spacing τ used in acoustic wave delay modification element 34 could be equal to ⅓ or ⅕ the period of the fundamental frequency of the transducers. A signal at the third or fifth harmonic of the fundamental frequency of the transducers would then be spread by the delay modification element by time steps corresponding to one acoustic wavelength at the third or fifth harmonic, respectively. It should be noted that the precision with which the spatial steps defining the acoustic wave delay modification element 34 are made is much less photolithographically demanding than production of long interdigital transducers (IDTs) at the corresponding frequency, and the acoustic wave delay modification element structure does not suffer from loss of acoustic wave energy into bulk modes in the same way as long IDTs. The loss of surface acoustic wave energy into bulk waves in IDTs is a result of reflections from the edges of the transducer electrodes into the bulk, so this loss is proportional to the number of electrodes. In the delay modification element, there may be only two edges, at the start and end of the delay modification element structure, avoiding almost all loss due to bulk wave conversion. Compared to an ordinary IDT-based SAW device, in which the filtering function is implemented in the transducers, the input and output transducers may be quite short in the present invention, which may significantly reduce the loss of surface wave energy into the bulk. In some embodiments, there is no specific requirement for the rectangles that make up the acoustic wave delay modification element to become sequentially longer from one side of the acoustic aperture to the other the same impulse response can be realized with these tracks 'shuffled' from side to side. Also, the rectangles that make up the acoustic wave delay modification element need not be lined up at one end, although this construction is convenient and makes the operation of this SAW element easier to understand. The rectangles of various lengths could be offset along the length of the acoustic propagation path in an essentially random or arbitrary manner, as long as they remain between the two transducers, and the resulting impulse response would be the same. Finally, we note that to reduce the effect of acoustic reflections from each end of each rectangle, it may be beneficial to utilize acoustic wave delay modification element track shapes that are parallelograms rather than rectangles. In this construction, each track has an acoustic wave delay modification element that has a lower edge and an upper edge, where the upper and lower edges are parallel and are at a non-zero angle with respect to the normal to the propagation path direction.

Figure 4:
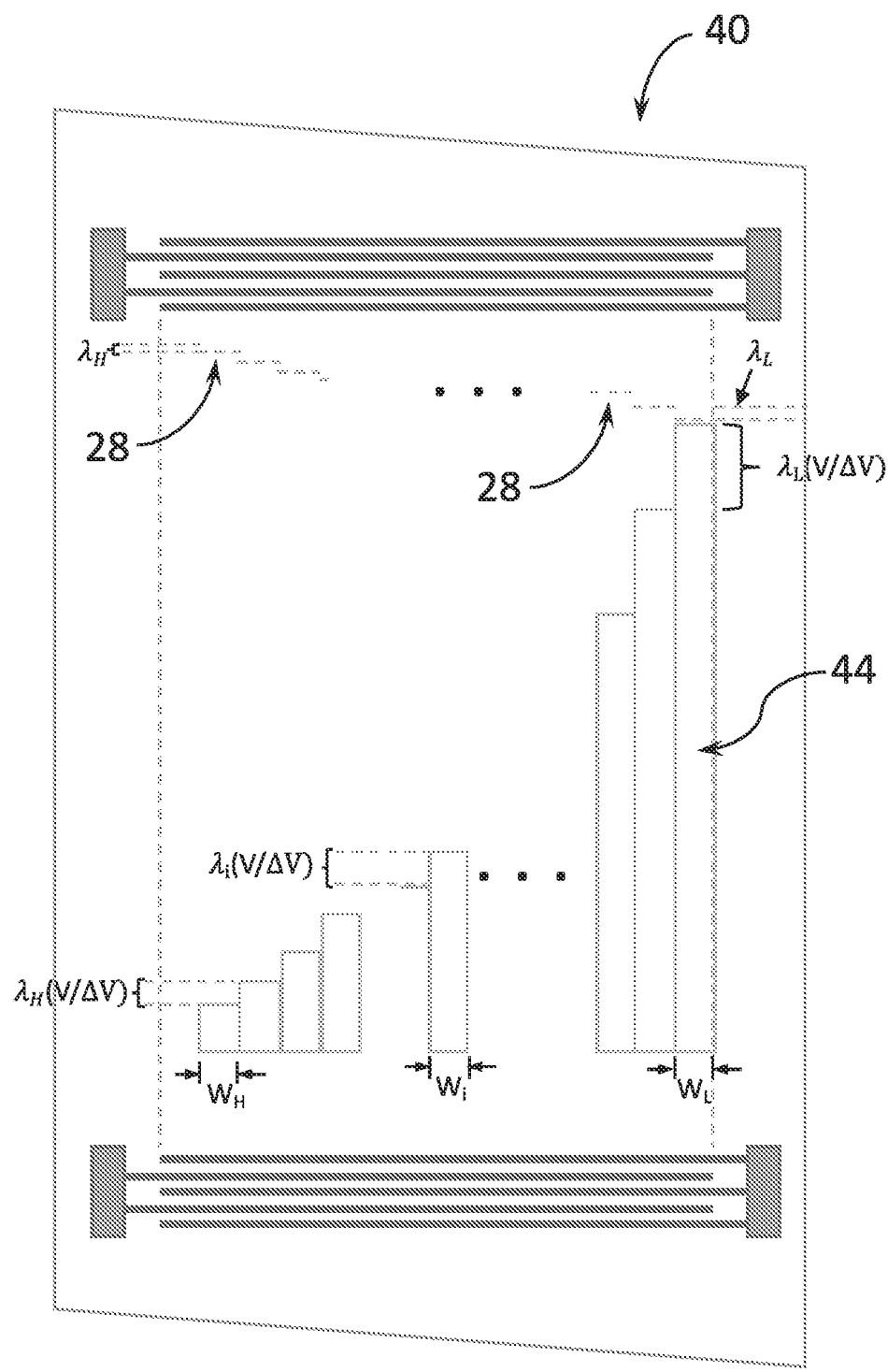
FIG. 4 shows a schematic representation of implementation of the SAW elements in a dispersive or linear FM filter according to the present invention.

Another embodiment of this invention is a dispersive or linear FM SAW filter 40 as shown in FIG. 4. In this example the high frequency end of the response is generated on the left side of the acoustic wave delay modification element and the frequencies decrease across the aperture to the lowest frequency on the right side. The difference between a dispersive filter and the non-dispersive one shown in FIG. 2 is that in the latter case all steps in delay are equal whereas for a dispersive filter each delay step in the acoustic wave delay modification element can be different Each delay step in the dispersive acoustic wave delay modification element 44 can be viewed as being equivalent to a "tap" in a transversal filter and the high frequency "taps" are on the left side (shown in FIG. 4 by $\lambda_H(V/\Delta V)$) of the block and the low frequency "taps" on the right (shown in FIG. 4 by $\lambda_L(V/\Delta V)$). Each delay step in the acoustic wave delay modification element corresponds to a frequency $f_i$ and the step is $\lambda_i V/\Delta V$ (where $\lambda_i=V/f_i$). The resulting wavefront 28 is composed of wavelets from each track that have been spatially (and temporally) spread out by the dispersive acoustic wave delay modification element 44. Note that the spacing between successive wavelets in the dispersive filter of FIG. 4 is $\lambda_H$ (corresponding to the high frequency) at the left edge of the aperture and $\lambda_L$ (corresponding to the low frequency) on the right edge of the aperture. Note, as above, that apodization can again be accomplished by weighting the widths of the acoustic tracks, as shown by the width labels $W_L \ldots W_i \ldots W_H$ in FIG. 4, which indicate that each track not only has an individual frequency, but also an individual width. Note that, as described above, spatial rearrangement of the dispersive acoustic wave delay modification subelements (shuffling among tracks or shifting positions along the acoustic wave propagation path) will not alter the response.

Figure 5:
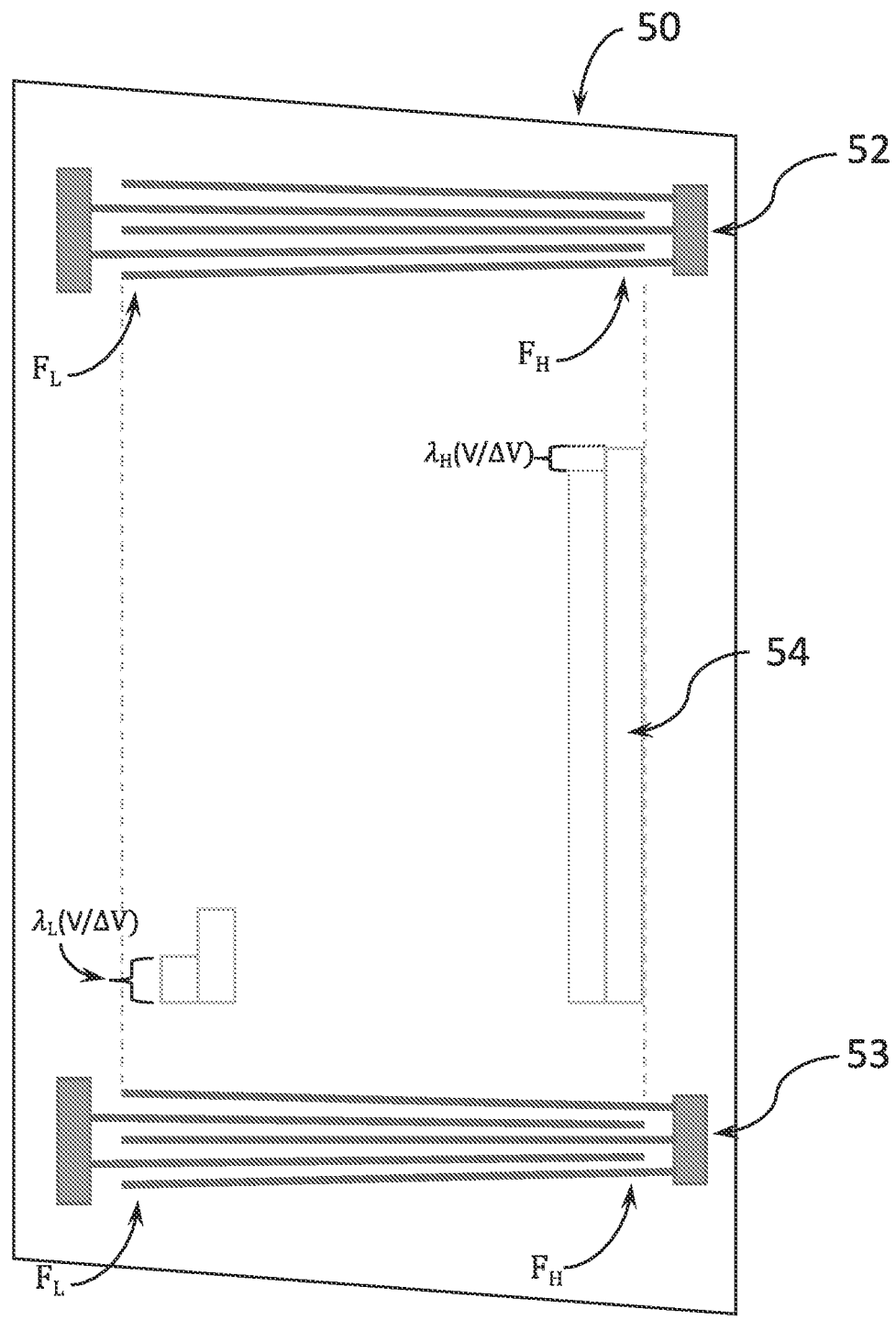
FIG. 5 shows a schematic representation of the SAW elements in a dispersive SAW filter utilizing tapered transducers according to the present invention.

Another embodiment of a dispersive acoustic wave delay modification element 54 is shown in SAW device 50 of FIG. 5. In this example the low frequency side of the acoustic wave delay modification element 54 is on the left, where the first delay step in the element is $\lambda_L V/\Delta V$ long, and the high frequency side is on the right, where the last delay step in the element is $\lambda_H V/\Delta V$ long. High frequency portions of the SAW spectrum passing through the left side of the wave delay modification element will not be detected by and will cancel at the output transducer, which results in a loss of energy. This is not intuitively obvious. High frequency components emerging from neighboring tracks in the low frequency portion of the block will be delayed by non-integral multiples of their wavelength, and thus will be out of phase with one another, and therefore will add out of phase to cancel one another when they are being detected at the output transducer. It is similar to when a high frequency SAW passes through a low frequency portion of a dispersive IDT. Each tap detects the SAW, but the signals coming from several adjacent taps are out of phase with each other and cancel at the bus bar, and so the high frequencies are not detected by the lower frequency portions of the transducer and vice versa. The losses in the filter can be reduced if the low frequency portion of the spectrum coming from the input transducer can be directed to the left, which is the low frequency, side of the block. Likewise, the high frequency portion of the spectrum coming from the input transducer is directed to the right side, which is the high frequency side, of the block, and intermediate frequencies at corresponding portions of the block. This can be accomplished by using tapered transducers 52 and 53 as the input and output transducers as shown in FIG. 5. In the tapered transducers 52 and 53 the low frequency side of the transducer has more widely spaced electrodes (labeled $F_L$ in FIG. 5) while the high frequency side of the transducer has more closely spaced electrodes (labeled $F_H$ in FIG. 5).

Figure 6:
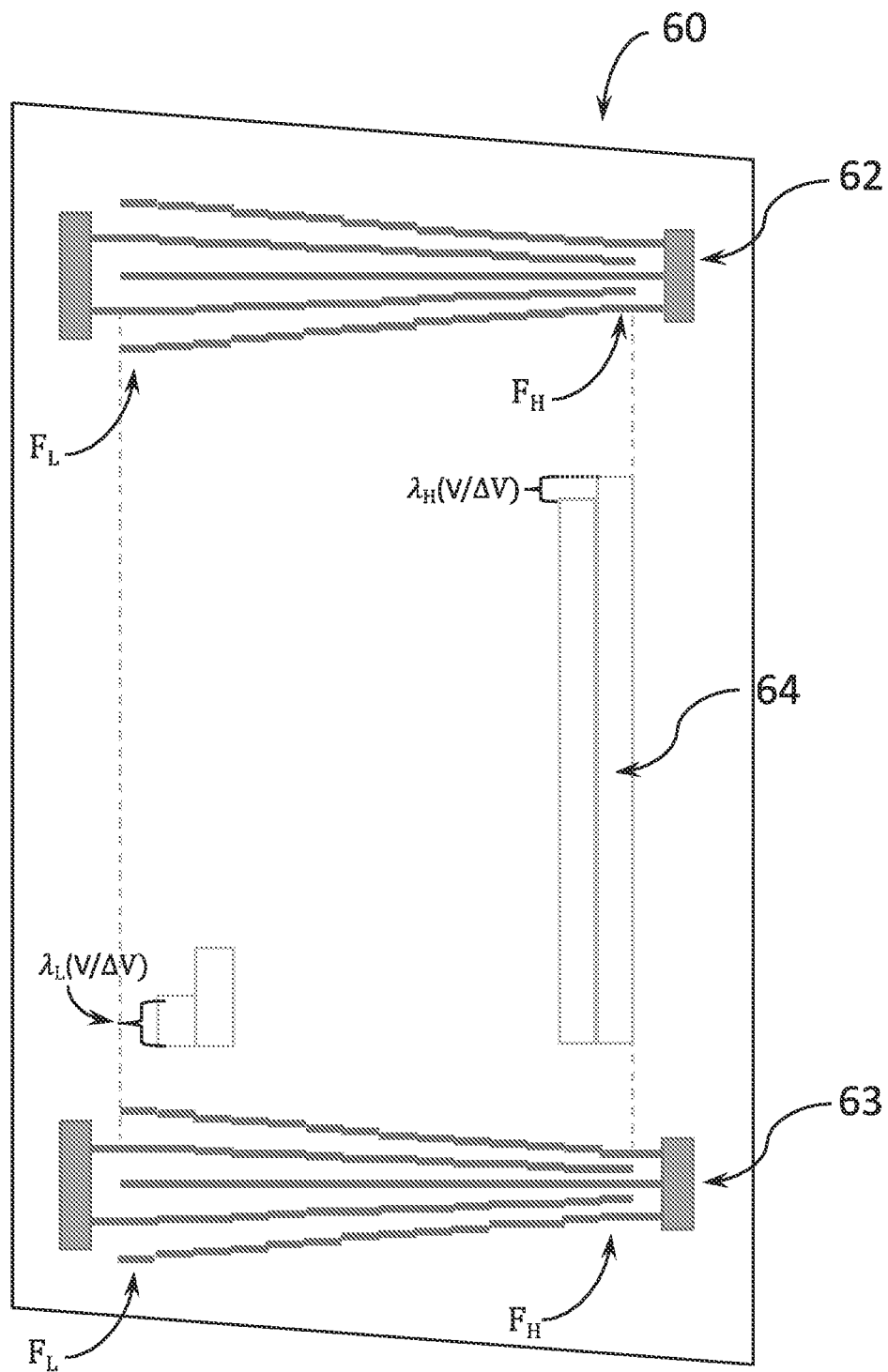
FIG. 6 shows a schematic representation of the SAW elements in a dispersive SAW filter utilizing step tapered transducers according to the present invention.

FIG. 6 shows another embodiment of a SAW device 60 that includes a dispersive acoustic wave delay modification element 64. In this embodiment, once again the low frequency side of the acoustic wave delay modification element 64 is on the left, where the first delay step in the element is $\lambda_L V/\Delta V$ long, and the high frequency side is on the right, where the last delay step in the element is $\lambda_H V/\Delta V$ long. The input and output transducers 63 and 64 in this device are stepped tapered, where each electrode in the transducers is stepped to produce electrode spacings within each acoustic channel that correspond to the frequency at which the acoustic wave delay modification element 64 responds synchronously, rather than being slanted (or continuously tapered) as shown in FIG. 5. Note that there are numerous known ways of constructing tapered transducers, including using subtransducers, that are not shown in these figures, but are within the scope of the present invention.

Use of any of a wide variety of other known types of SAW transducers, including unidirectional transducers, transducers that generate various harmonics, dispersive transducers, coded transducers, and others are expected to be useful in devices built according to the present invention.

Figure 7:
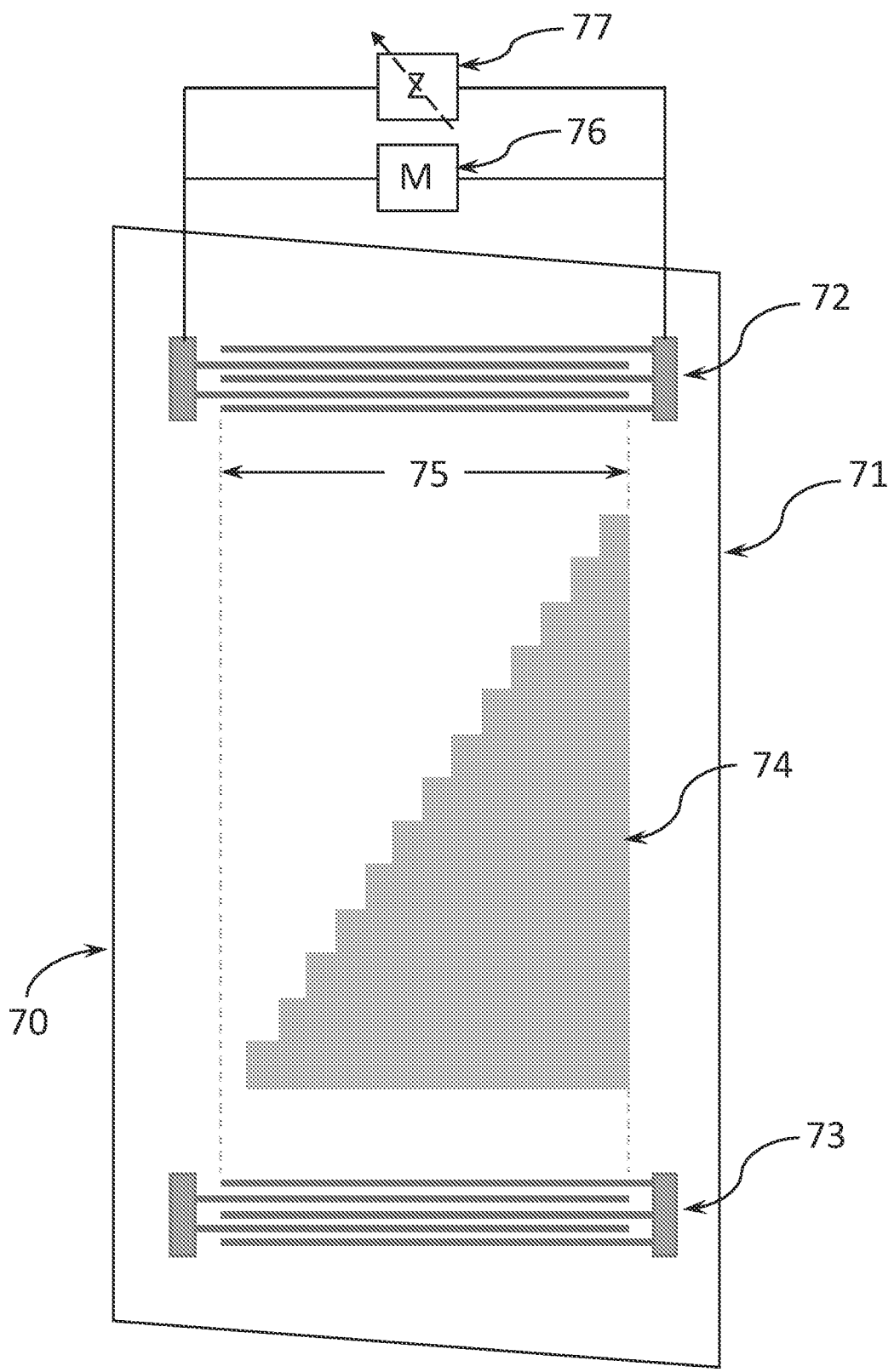
FIG. 7 shows an embodiment of a SAW sensor incorporating a stepped acoustic wave delaying element with the reflected SAW signal responsive to the impedance of an external impedance-varying sensor, according to the present invention.

FIG. 7 shows a SAW sensor-tag 70 according to the present invention. This device includes piezoelectric substrate 71, input/output transducer 73 and reflective transducer 72, acoustic wave delay modification element 74, acoustic aperture 75, external electrically connected variable impedance sensor load 77, and impedance matching circuit element 76. This type of sensor-tag often uses a single IDT 73 as both input and output. The signal arriving at the reflective IDT 72 is not uniform because of the operation of the acoustic wave delay modification element 74, but the IDT is. The EDT 72 converts the nonuniform SAW, which has been spatially and temporally modified and also weighted (apodized) to an electrical output signal. A sensing element 77 which is connected to the optional matching circuit 76 (or is part of the matching circuit) has a variable impedance which acts as a measurand for the parameter being sensed. The electrical mismatch of this variable impedance network (sensor 77 together with matching circuit 76) causes a reflected SAW of variable amplitude to be regenerated by IDT 72 as a reflected signal. The regenerated (reflected) SAW is now uniform across its aperture. This SAW is filtered again as it passes through the acoustic wave delay modification element and back to the input/output IDT. In this manner the filtering functions are cascaded as the SAW propagates back and forth across the substrate. This is particularly useful for a dispersive filter because both the delay time and the processing gain are doubled. We note that any of the other embodiments shown in FIGS. 1 through 6 could also be operated in single-port mode, with one transducer acting as input/output transducer and the other transducer serving as a reflector. Similar one-port embodiments where the reflective transducer has been replaced by other types of acoustic wave reflector elements (such as gratings, etc.) are within the scope of the present invention. Also, many other device embodiments that combine the elements shown with other SAW elements such as multistrip couplers, waveguides, and others are conceivable.

Figure 8:
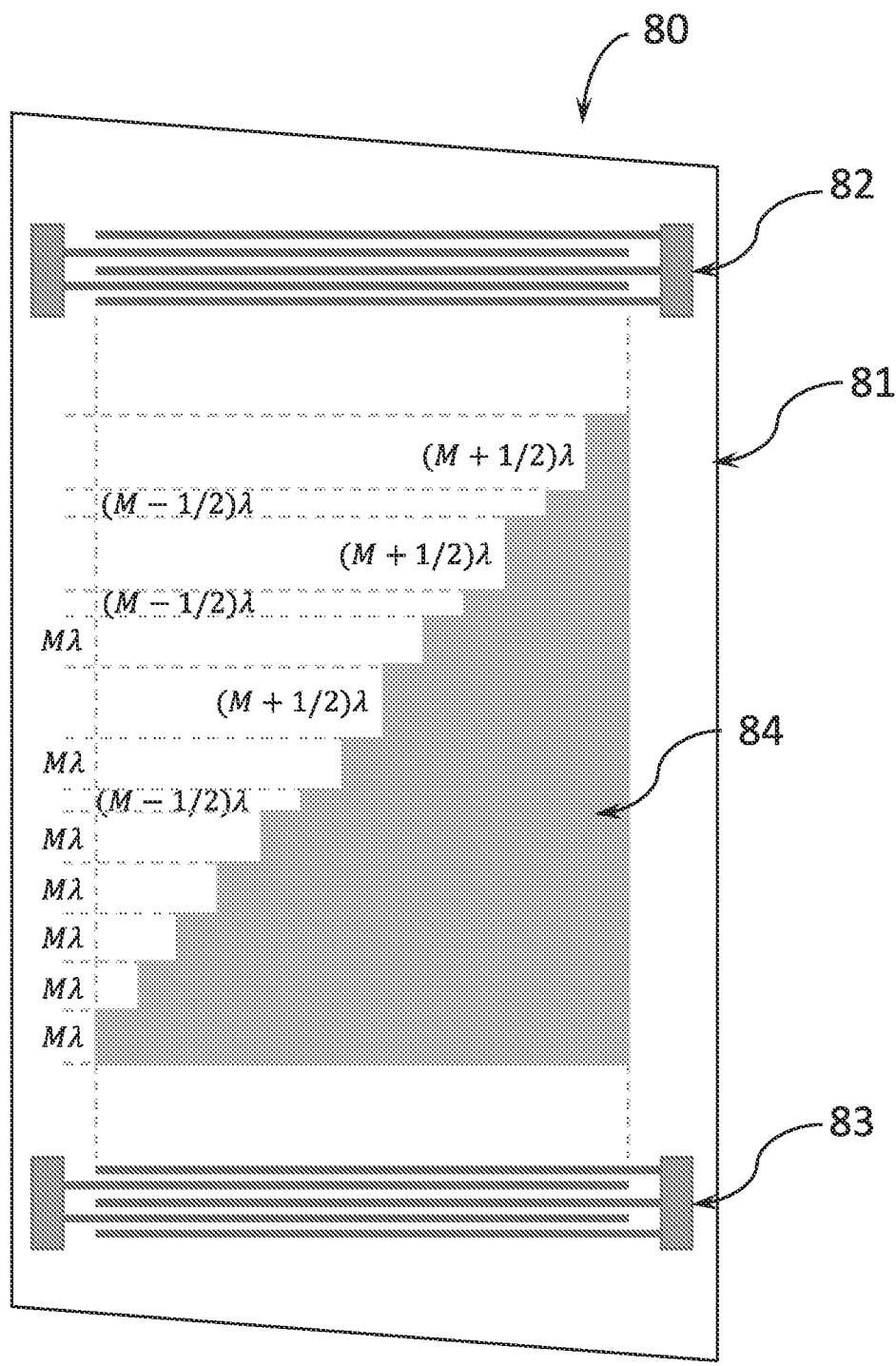
FIG. 8 shows a schematic representation of the SAW elements in a coded SAW filter according to the present invention wherein a stepped acoustic wave delaying element implements a 13-bit Barker code with 1λ/bit.

FIG. 8 shows a direct sequence spread spectrum (DSSS) coded SAW device 80 according to the present invention. Transducers 82 and 83 and acoustic wave delay modification element 84 are formed on the surface of piezoelectric substrate 81. The acoustic wave delay modification element 84 shown is structured to implement a 13-bit Barker coded wave having code 1,1,1,1,1,−1,−1,1,1,−1,1,−1,1. To implement the code, each time the polarity of a bit changes from plus to minus the delay modification element introduces a step of $(M-\frac{1}{2})\lambda$, while every time the polarity of a bit changes from minus to plus the delay modification element introduces a step of $(M+\frac{1}{2})\lambda$. When the bits retain the same polarity from track to track, the step size is $M\lambda$. In a preferred embodiment, each bit would be considerably longer than $\lambda$ to ensure that the relative strength of each bit in the code remains almost constant. Using and integer number of M=8 to 10 wavelengths per bit keeps the bit strength remain fairly constant. For the 13-bit Barker code shown in FIG. 8, the added delay due to the acoustic wave delay modification element in each of the first (leftmost) five acoustic tracks corresponds to an integer multiple of acoustic wavelengths ($M\lambda$), although for practical purposes the leftmost track could be left without a film delay modification element and the device would be shorter. The delay modification in the next track increases by $(M-\frac{1}{2})\lambda$, the next track delay modification is $M\lambda$, the next track delay modification is $(M+\frac{1}{2})\lambda$, followed by $M\lambda$, $(M-\frac{1}{2})\lambda$, $M+\frac{1}{2})\lambda$, $(M-\frac{1}{2})\lambda$, and $(M+\frac{1}{2})\lambda$ (for tracks moving from left to right). Wavelets emerging from tracks with delay adjustments of $\lambda$ will be in phase with the initial wavelet from the leftmost track, and will add in phase. Thus acoustic wave delay modification element 84 takes the uniform wavefront emitted by transducer 83 introduces 180 degree phase offsets into the wavelets to turns it into a 13-bit Barker coded wavefront having the code 1,1,1,1,1,−1,−1,1,1,−1,1,−1,1. As read by the output transducer 82, this produces a 13-bit Barker coded SAW device response.

Note that the number of wavelengths in each bit of the Barker code can be controlled, as a multiple of the number of acoustic wavelengths by which the wave is delayed, replacing each step that was a delay of $\lambda$ in the prior example with a step that has a delay modification of $M\lambda$, and replacing each step that was a delay of $\lambda/2$ in the prior example with a step that has a delay modification of $(2M-1)\lambda/2$. Note that in general, a step of $(2M+1)\lambda/2$ would also function as desired. Also, it is clear that this particular code is just one example of a wide range of DSSS codes that can be implemented in properly structured acoustic wave delay modification elements. Symmetric codes can be implemented in a reflective coded device, where the acoustic wave reflects off of the second transducer (or reflector) and traverses the acoustic wave delay modification element twice, picking up half of the code on the first transit and the remainder on the second transit of the acoustic wave delay modification element. The step delay modifications would need to be adjusted appropriately.

While the acoustic tracks within acoustic wave delay modification element 84 are shown for convenience as being equal in width in FIG. 8, track width can be adjusted to provide apodization of the coded response, if so desired. We note as well that in all of the embodiments shown, there may be a small amount of wave attenuation caused by the acoustic wave delay modification element. Thus, a track width apodization that increases track width slightly as the length of the region covered by the delay modification element within that track increases could be used to offset this loss and produce a uniform amplitude response.

Figure 9:
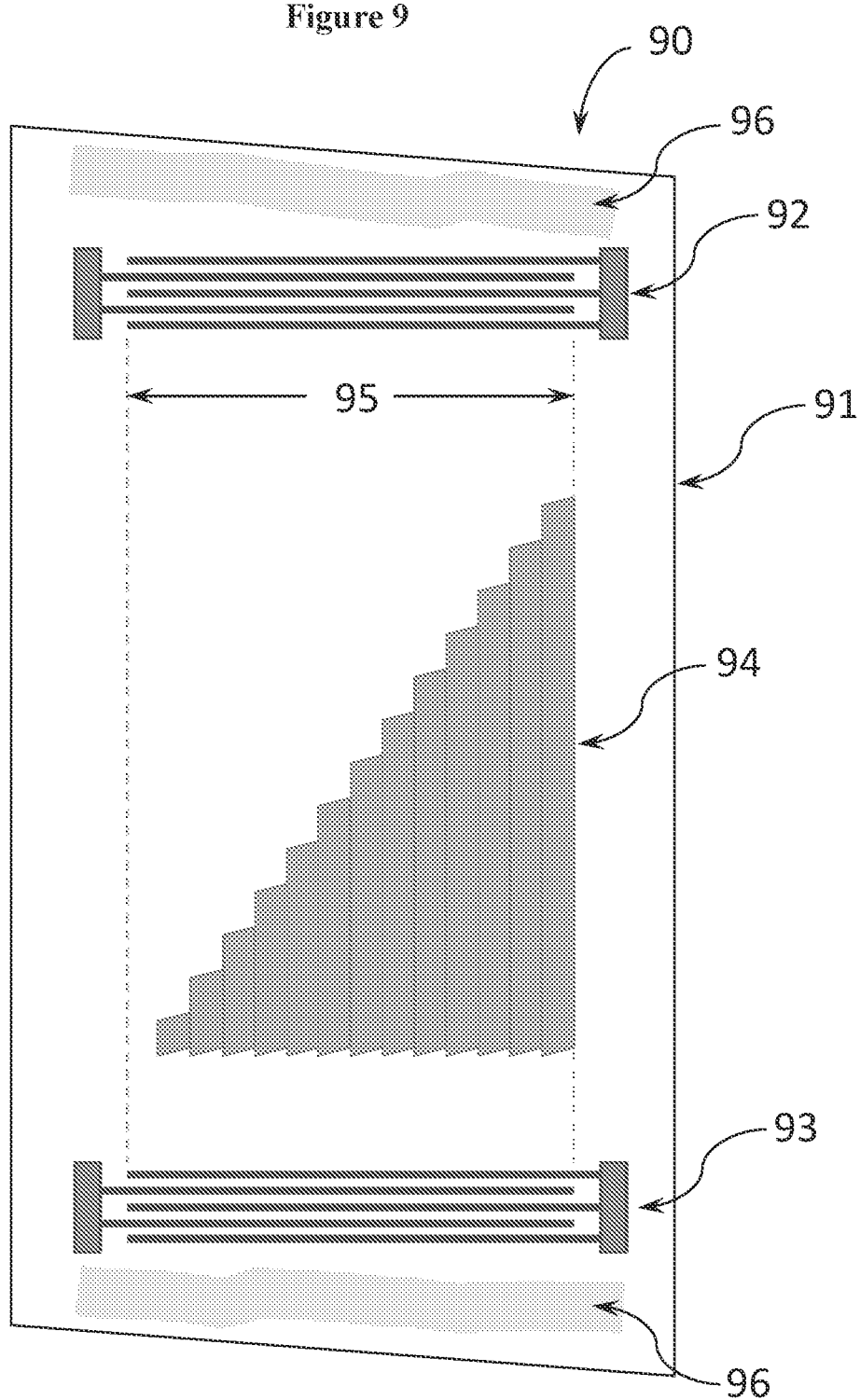
FIG. 9 shows a SAW device with a stepped acoustic wave delaying element implemented to reduce edge reflections from the element, according to the present invention.

FIG. 9 shows a modified version 90 of the SAW device 10 shown in FIG. 1. SAW device 90 in FIG. 9 comprises a piezoelectric substrate 91 on which a surface acoustic wave is launched by interdigital transducer 93, which launches a surface acoustic wave upward toward the stepped acoustic wave delay modification element 94. The acoustic wave has a uniform wavefront as it exits transducer 93, and exists over the entire acoustic aperture 95. The acoustic wave propagation direction is again upward (ignoring any wave launched downward from transducer 93, which is attenuated by acoustic absorber 96), perpendicular to the electrodes in transducer 93. At the far left side of the acoustic aperture, the acoustic propagation path is again a free surface path, while over the rest of the aperture the wave propagates through the stepped element, with delay times determined by the acoustic wave velocity under the stepped element and the propagation length through the element for each step. After exiting the stepped element, the wavefront, which now had been spread out in time by the stepped acoustic wave delay modification element 94, is detected by output interdigital transducer 92.

The difference between this embodiment and that of FIG. 1 is the shape of the delay modification film regions within each acoustic track (corresponding to each step) of the stepped acoustic wave delay modification element 94, which in FIG. 1 are rectangular but in element 94 of the SAW device embodiment of FIG. 9 are parallelograms Use of parallelogram delay modification film regions in the step tracks, with the long sides of the parallelograms parallel to the direction of wave propagation, results in the ends of the tracks on which the acoustic wave is incident being at a non-zero angle to the acoustic wavefront, which reduces reflections from these edges. Steps with rectangular edges at the top and bottom (as shown in FIG. 1) can cause acoustic wave reflections, as these edges present electrical and mechanical discontinuities to the propagating wave. Angling these ends as in 94 cause reflections to add out of phase, or cancel, in the direction from which the wave came, while retaining the constant wavefront delay modification intended. This is the case since at each point across the individual track, the distance between the bottom edge of the track delay modification element (which is a parallelogram) and the top edge of that element is constant. Thus, each point of the propagating acoustic wave in that track will travel the same distance through the delay modification element, and hence will experience the same modification in delay. At the output of delay modification element 94, the wavelet exiting from each track will be in phase across the whole wavelet, and that wavelet will be delayed by the same amount it would have been delayed by for the acoustic wave delay modification element 14 of FIG. 1, provided the length of the rectangular regions of FIG. 1 are the same as the length of the parallelogram regions of FIG. 9.

Figure 10:
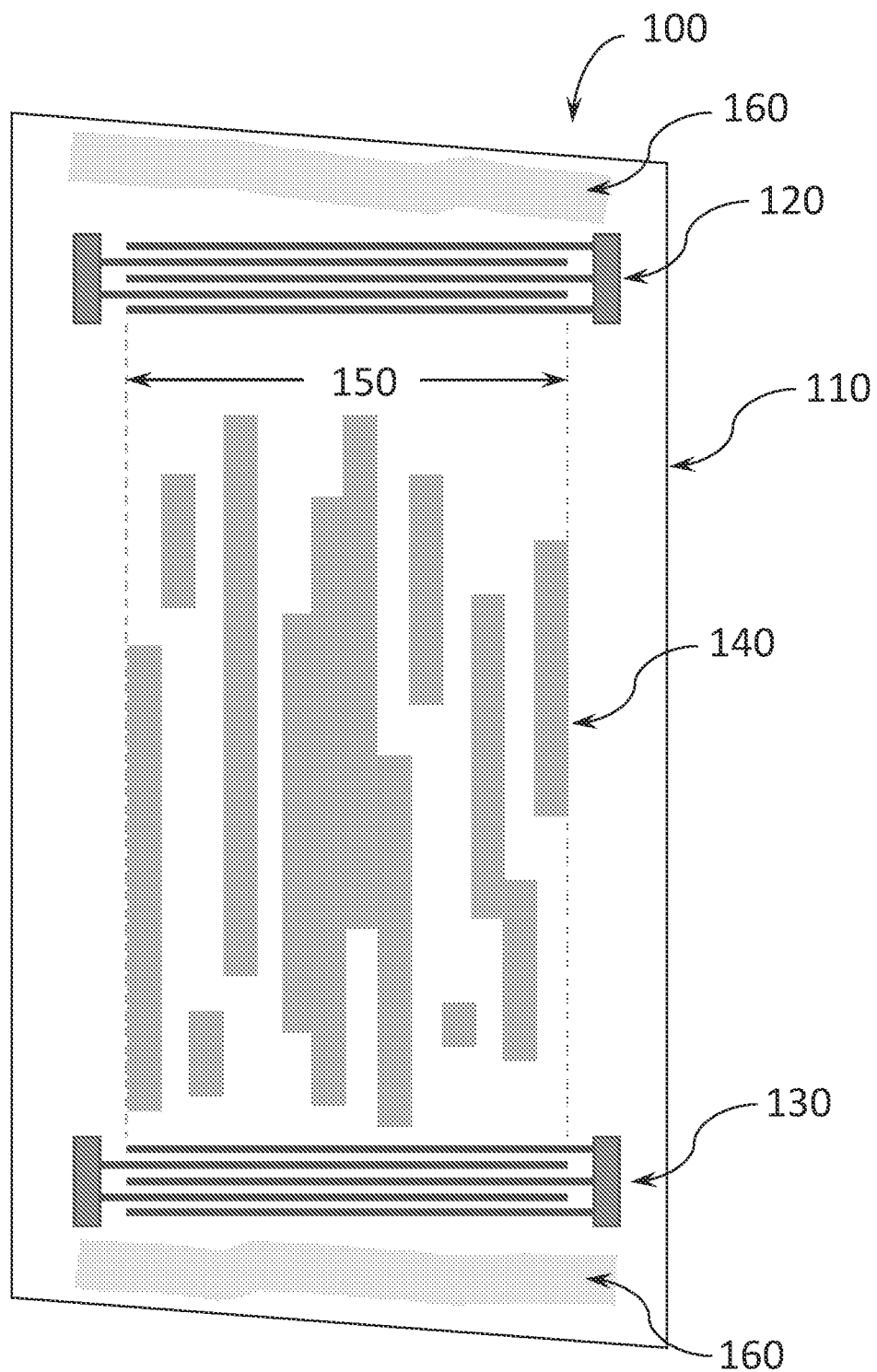
FIG. 10 shows a SAW device with an offset (staggered) and shuffled (left-right) acoustic wave delaying element according to the present invention.

FIG. 10 shows yet another modified version 100 of the SAW device 10 shown in FIG. 1. SAW device 100 in FIG. 10 comprises a piezoelectric substrate 110 on which a surface acoustic wave is launched by interdigital transducer 130, which launches a surface acoustic wave upward toward the stepped acoustic wave delay modification element 140. The acoustic wave again has a uniform wavefront as it exits transducer 130, and exists over the entire acoustic aperture 150. The acoustic wave propagation direction is again upward (ignoring any wave launched downward from transducer 130, which is attenuated by acoustic absorber 160), perpendicular to the electrodes in transducer 130. In FIG. 1, the acoustic propagation path at the far left side of the acoustic aperture is a free surface path, while over the rest of the aperture the wave propagates through steps of the stepped element that increase in length by defined increments moving from left to right across the acoustic aperture 15. In the offset (or staggered) and shuffled acoustic wave delay element 140 of FIG. 10, however, the rectangular film regions of the acoustic wave delay modification element 140 have been shuffled (left to right) in an arbitrary manner and staggered by offsetting them by arbitrary distances along the direction of acoustic wave propagation (keeping all delay modification elements between transducers 120 and 130). In the acoustic wave delay modification element 140 of FIG. 10, the free surface propagation track is the fifth track from the left. It will be clear to one skilled in the art that the delay modification elements in the various tracks can be rearranged in almost any manner, provided that they are in separate tracks, within the overall acoustic aperture 150, and between transducers 120 and 130, and the wavefront emerging from acoustic wave delay modification element 140 will be equivalent to that in FIG. 1 or FIG. 2. The track delay modification elements can be shuffled (from side to side) and not offset (or staggered), with the bottom of the track delay modification elements coincident as shown in FIGS. 1 through 9, or the track delay modification elements can be offset along the direction of propagation without being shuffled (left to right). The delay times of wavelets emerging from each track will still be determined by the acoustic wave velocity under the track delay modification sub-elements and the propagation length through the element for each step. After exiting the delay modification element, the wavefront, which now had been spread out in time by the stepped acoustic wave delay modification element 140, is detected by output interdigital transducer 120 or another SAW element that is uniform across the aperture 150.

We note that the output transducer (such as 120 in FIG. 10) has been shown as a single component in all embodiments illustrated in the Figures herein, But one skilled in the art would recognize that there are device embodiments where the use of multiple SAW elements (such as transducers, reflectors, multistrip couplers, among others) would be beneficial. Such elements could all be disposed across the entire acoustic aperture 150, but be located at different distances from the input transducer 130, as would be the case in a tapped delay line. Or the elements could each be disposed across only a portion of the acoustic aperture 150, at the same or different distances from the input transducer 130, allowing the signal from only a portion of the wavefront to interact with each element. Such arrangements of elements, which are numerous, are within the scope of the present invention.

The foundational nature of the present invention for SAW device construction is clear, as any waveform that can be realized by an interdigital transducer transversal filter can also be realized by an acoustic wave delay modification element transversal filter. This includes not only bandpass filters, but also dispersive filters, frequency coded filters and phase coded filters. There are two significant advantages of the acoustic wave delay modification element transversal filter over an interdigital transducer transversal filter. The first is that there are no critical line widths to the acoustic wave delay modification element, so photolithographic resolution is significantly easier. The second advantage is that the insertion loss is lower than for comparable interdigital transducer filters. One reason why this is true is that the acoustic wave delay modification element filter structure eliminates the need for long interdigital transducers operating at higher harmonic frequencies, which are inherently lossy. Harmonic generation by an IDT may be necessary for high frequency operation (without extremely fine lithography), but the IDT in an acoustic wave delay modification element filter can be short and therefore not radiate a lot of energy into the bulk. The major source of bulk wave radiational loss in harmonic operation is due to reflections of the SAW into bulk waves from the electrodes of the IDT. This loss is therefore proportional to the length of the IDT. The transversal filter function is typically quite long, i.e. 100 wavelengths or more, so the bulk wave radiation loss is generally large. In the present invention, the only function of the IDT is to launch a harmonic SAW, and this only requires a transducer 10 wavelengths long (or less), so the bulk wave loss is reduced by at least a factor of 10.

The illustrations included herein are exemplary in nature, and do not encompass all aspects of the present invention. One skilled in the art would recognize that the improvements provided by embodiments of this invention can be implemented using any of a wide variety of known SAW elements in combination with the acoustic wave delay modification element according to the present invention, to realize SAW devices with desirable characteristics. One skilled in the art would also recognize that various combinations of features of the acoustic wave delay modification elements shown herein could be combined to advantage. For instance, coding can be combined with apodization, dispersion can be combined with apodization, tapered and step-tapered transducers can be used with a variety of delay element configurations, and output SAW elements can be selected from among a wide variety of SAW elements including transducers, reflectors, and multistrip couplers for use with combinations of the other elements. Combinations of the claimed elements are within the scope of the present invention. The examples provided in this specification are not all-inclusive, and other implementations that would be apparent to one skilled in the art should be considered within the scope of the present invention.

One skilled in the art would also recognize that the improvements provided by embodiments of this invention can be implemented to work with any of a wide range of known SAW sensor and sensor-tag structures, including but not limited to those incorporating various diversity techniques (code, chirp, time, and frequency diversity among others). A wide range of known coding techniques can be implemented in combination with the embodiments described. It would be understood by one versed in the art that simple on-off keying, phase modulation, pulse position modulation, and many other techniques could be used with the techniques described herein to enhance the number of codes that work together without interference. Frequency diversity, code diversity, time diversity, and other known techniques can be combined to achieve sets of devices with desirable properties. Any of these techniques could be utilized in the aforementioned device embodiments to increase the number of sensors that can work together in a system. Devices utilizing such structures could also be useful for RFID tag and sensor-tag applications, where identification of individual devices is desired. In addition, combinations of these techniques may be advantageous in certain circumstances, Various radio architectures, including software defined radios, can be used to implement wireless monitoring systems that incorporate SAW sensors and sensor-tags that utilize delay modification elements according to the present invention.

Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A surface acoustic wave (SAW) device comprising:
   a piezoelectric substrate;
   at least one SAW element comprising an interdigital transducer (IDT);
   said at least one IDT configured to launch acoustic waves onto said piezoelectric substrate as a combined wavefront that extends across an overall acoustic aperture;
   wherein said overall acoustic aperture is divided spatially into a set of acoustic tracks parallel to the direction of acoustic wave propagation;
   wherein the portion of the combined wavefront propagating in each acoustic track is a wavelet;
   wherein the combination of all the wavelets propagating in each track comprises the overall wavefront; and
   a stepped acoustic wave delay modification element, comprising:
   multiple regions within the acoustic tracks;
   wherein the multiple regions include two or more film regions in which a thin film of a material that will alter the SAW velocity is formed on the surface of said piezoelectric substrate; and
   wherein lengths of the two or more film regions vary from track to track to create steps in the delay of the wavelets emerging from the acoustic tracks; and
   wherein the combined wavefront comprising wavelets from all of the acoustic tracks emerging from said stepped acoustic wave delay modification element is spread out in time to implement a transversal filter impulse response function; and
   at least one additional SAW element configured to interact with said combined wavefront across the entire aperture.

2. A SAW device as in claim 1;
   wherein said thin film of the material that will alter the SAW velocity is selected from among the material classes of metals, semiconductors, nanostructured materials, or dielectrics.

3. A SAW device as in claim 1;
   wherein the difference in the length of the film region between each acoustic track and the acoustic track with the next longer film region is a length that introduces a delay equal to one period of the acoustic wave at the center frequency of operation of the stepped acoustic wave delay modification element;
   wherein the wavelets emerging from all of the acoustic tracks are in phase; and
   wherein the combined wavefront comprised of wavelets from all of the acoustic tracks emerging from said stepped acoustic wave delay modification element is spread out in time to implement a desired transversal filter impulse response function.

4. A SAW device as in claim 1, further comprising
   wherein the width of each acoustic track within said stepped acoustic wave delay modification element is modified to alter the amount of energy contained in the wavelet emerging from said track, relative to the other wavelets, to implement apodization or weighting of wavelets emerging at different delay times; and wherein the combined wavefront comprising wavelets from all of the acoustic tracks emerging from said stepped acoustic wave delay modification element is spread out in time and amplitude weighted to implement a desired transversal filter impulse response function.

5. A SAW device as in claim 1;
wherein said at least one IDT further comprises a tapered transducer.

6. A SAW device as in claim 1;
wherein said at least one IDT further comprises a step-tapered transducer.

7. A SAW device as in claim 1;
wherein the difference in the length of the film region between each acoustic track and the acoustic track with the next longer film region is a length that introduces a delay equal to either an integer multiple of one period of the acoustic wave (Mτ) or a delay that differs by half a period (2M±1)τ/2 from said integer multiple of one period of the acoustic wave at the center frequency of operation of said stepped acoustic wave delay modification element;
wherein the wavelets emerging from certain acoustic tracks are in phase with wavelets emerging from certain other acoustic tracks; and
wherein the wavelets emerging from other certain acoustic tracks are out of phase with wavelets emerging from still other certain other acoustic tracks and cancel; and
wherein the combined wavefront comprising wavelets from all of the acoustic tracks emerging from said stepped acoustic wave delay modification element is spread out in time phase modulated to implement a coded sequence.

8. A SAW device as in claim 1;
wherein the difference in the length of the film region between each acoustic track and the acoustic track with the next longer film region is a length that introduces a delay that varies from track to track;
wherein the step in length of the film region between each acoustic track and the acoustic track with the next longer film region is given by $\lambda_i V/\Delta V$, where $\lambda_i$ is the local wavelet frequency, V is the free surface SAW velocity, and $\Delta V$ is the change in wave speed caused by the presence of the film;
wherein the wavelets emerging from each acoustic track are at different frequencies than the wavelets emerging from certain other acoustic tracks; and
wherein the combined wavefront comprising wavelets from all of the acoustic tracks emerging from said stepped acoustic wave delay modification element is spread out in both time and frequency to implement a dispersive transversal filer impulse response function.

9. A SAW sensor-tag device, comprising
a SAW device as in claim 1, further comprising
an external impedance varying sensor electrically connected across one of said at least one additional SAW element;
wherein variation of the impedance of said impedance varying sensor is indicative of at least one parameter to be measured; and
wherein changes in the impedance of said impedance varying sensor cause changes in the amplitude of the surface acoustic wave response produced by said at least one additional SAW element;
whereby a SAW sensor-tag device that measures at least one parameter is realized.

10. A SAW device as in claim 1, wherein
the regions within each acoustic track that are coated with a thin film of a material that will alter the SAW velocity are shaped like rectangles;
wherein the long side of each rectangle is oriented parallel to the direction of the acoustic tracks which is also the direction of acoustic wave propagation.

11. A SAW device as in claim 1, wherein
the regions within each acoustic track that are coated with a thin film of a material that will alter the SAW velocity are shaped like parallelograms;
wherein the long side of each parallelogram is oriented parallel to the direction of the acoustic tracks which is also the direction of acoustic wave propagation.

12. A SAW device as in claim 1, wherein
the regions within each acoustic track that are coated with a thin film of a material that will alter the SAW velocity are arranged such that one end of all the film regions are lined up at one distance along the direction of acoustic wave propagation from the center of said at least one IDT.

13. A SAW device as in claim 1, wherein
the regions within each acoustic track that are coated with a thin film of a material that will alter the SAW velocity are arranged such that the ends of each of the film regions are staggered at two or more different distances along the direction of acoustic wave propagation from the center of said at least one IDT.

14. A SAW device as in claim 1, wherein
the regions within each acoustic track that are coated with a thin film of a material that will alter the SAW velocity are arranged in order of increasing length across the acoustic aperture.

15. A SAW device as in claim 1, wherein
the regions within each acoustic track that are coated with a thin film of a material that will alter the SAW velocity are shuffled transversely to the direction of acoustic wave propagation such that they are not arranged in order of increasing length across the acoustic aperture.

16. A SAW device as in claim 1, wherein
the at least one additional SAW element with a uniform beam across the entire aperture to interact with said combined wavefront is an interdigital transducer.

17. A SAW device as in claim 1, wherein
the at least one additional SAW element with a uniform beam across the entire aperture to interact with said combined wavefront is a reflector.

18. A SAW device as in claim 1, wherein
the at least one additional SAW element with a uniform beam across the entire aperture to interact with said combined wavefront is a multi strip coupler.

19. A surface acoustic wave (SAW) device comprising:
a piezoelectric substrate;
at least one SAW element comprising an interdigital transducer (IDT);
said at least one IDT configured to launch acoustic waves onto said piezoelectric substrate as a combined wavefront that extends across an overall acoustic aperture;
wherein said overall acoustic aperture is divided spatially into a set of acoustic tracks parallel to the direction of acoustic wave propagation
wherein the portion of the combined wavefront propagating in each acoustic track is a wavelet;
wherein the combination of all the wavelets propagating in each track comprises the overall wavefront; and a stepped acoustic wave delay modification element, comprising:
multiple regions within the acoustic tracks;
wherein the multiple regions include two or more thin film regions in which a thin film of a material that will alter the SAW velocity is formed on the surface of said piezoelectric substrate; and
wherein lengths of the two or more film regions vary from track to track to create steps in the delay of the wavelets emerging from the acoustic tracks; and
wherein the combined wavefront comprising wavelets from all of the acoustic tracks emerging from said stepped acoustic wave delay modification element is spread out in time to implement a transversal filter impulse response function; and
at least two additional SAW elements with individual acoustic apertures that each cover a portion of the entire aperture over which the combined wavefront exists, each of the at least two additional SAW elements being configured to interact with a portion of said combined wavefront.

\* \* \* \* \*